United States Patent [19]

Saxe et al.

[11] Patent Number: 5,144,525

[45] Date of Patent: Sep. 1, 1992

[54] ANALOG ACQUISITION SYSTEM INCLUDING A HIGH SPEED TIMING GENERATOR

[75] Inventors: Charles L. Saxe; Steven K. Sullivan, both of Beaverton; Grigory Kogan, Portland, all of Oreg.

[73] Assignee: Tektronix, Inc., Wilsonville, Oreg.

[21] Appl. No.: 589,222

[22] Filed: Sep. 27, 1990

[51] Int. Cl.[5] .............................................. G11C 27/04
[52] U.S. Cl. ...................................... 365/45; 365/194; 365/240
[58] Field of Search ................. 365/45, 193, 194, 240, 365/149

[56] References Cited

U.S. PATENT DOCUMENTS 4,271,488  6/1981  Saxe ...................... 365/240

Primary Examiner—Joseph A. Popek
Attorney, Agent, or Firm—Peter J. Meza

[57] ABSTRACT

An analog acquisition system includes an array of analog capture cells for capturing and storing a signal on an analog bus. Each capture cell in the array may be sequentially selected for sampling the signal at successive sample times. Timing for selecting a row of the analog memory array is provided by a slow shift register and timing for selecting a capture cell within the row of the analog memory array is provided by a fast tapped delay line. Additional circuitry is provided for controlling the delay of the tapped delay line such that total delay is equal to the time the slow shift register takes to transfer from one row to the next.

66 Claims, 18 Drawing Sheets

SHIFT REGISTER CONTENTS

| $E_1$ | $E_2$ | $E_3$ | $E_4$ | $E_5$ | $E_6$ | $E_7$ | $E_8$ | $E_9$ | $E_{10}$ | $E_{11}$ | |
|---|---|---|---|---|---|---|---|---|---|---|---|
| 1 | 1 | 1 | 1 | 1 | 1 | 1 | 1 | 1 | 1 | 1 | FULL SAMPLE RATE |

| $E_1$ | $E_2$ | $E_3$ | $E_4$ | $E_5$ | $E_6$ | $E_7$ | $E_8$ | $E_9$ | $E_{10}$ | $E_{11}$ | |
|---|---|---|---|---|---|---|---|---|---|---|---|
| 1 | 0 | 1 | 0 | 1 | 0 | 1 | 0 | 1 | 0 | 1 | ÷2 SAMPLE RATE |
| 0 | 1 | 0 | 1 | 0 | 1 | 0 | 1 | 0 | 1 | 0 | |

| $E_1$ | $E_2$ | $E_3$ | $E_4$ | $E_5$ | $E_6$ | $E_7$ | $E_8$ | $E_9$ | $E_{10}$ | $E_{11}$ | |
|---|---|---|---|---|---|---|---|---|---|---|---|
| 1 | 0 | 0 | 0 | 0 | 1 | 0 | 0 | 0 | 0 | 1 | |
| 0 | 0 | 0 | 0 | 1 | 0 | 0 | 0 | 0 | 1 | 0 | |
| 0 | 0 | 0 | 1 | 0 | 0 | 0 | 0 | 1 | 0 | 0 | ÷5 SAMPLE RATE |
| 0 | 0 | 1 | 0 | 0 | 0 | 0 | 1 | 0 | 0 | 0 | |
| 0 | 1 | 0 | 0 | 0 | 0 | 1 | 0 | 0 | 0 | 0 | |

| $E_1$ | $E_2$ | $E_3$ | $E_4$ | $E_5$ | $E_6$ | $E_7$ | $E_8$ | $E_9$ | $E_{10}$ | $E_{11}$ | |
|---|---|---|---|---|---|---|---|---|---|---|---|
| 1 | 0 | 0 | 0 | 0 | 0 | 0 | 0 | 0 | 0 | 1 | |
| 0 | 0 | 0 | 0 | 0 | 0 | 0 | 0 | 0 | 1 | 0 | |
| 0 | 0 | 0 | 0 | 0 | 0 | 0 | 0 | 1 | 0 | 0 | ÷10 SAMPLE RATE |
| 0 | 0 | 0 | 0 | 0 | 0 | 0 | 1 | 0 | 0 | 0 | |
| 0 | 0 | 0 | 0 | 0 | 0 | 1 | 0 | 0 | 0 | 0 | |
| 0 | 0 | 0 | 0 | 0 | 1 | 0 | 0 | 0 | 0 | 0 | |

*FIG. 18*

ANALOG ACQUISITION SYSTEM INCLUDING A HIGH SPEED TIMING GENERATOR

BACKGROUND OF THE INVENTION

This invention relates to acquisition of high frequency analog signals.

A high speed FISO (fast in, slow out) acquisition system is described in U.S. Pat. No. 4,271,488 to Saxe. FIG. 1 of this prior art patent teaches and shows a memory array 10 in which sample and hold elements 12 are used to sample an analog signal from an analog bus 14. Each sample and hold element is selected by digital command from an X shift register 22 and a Y shift register 24. The acquisition system enables sampling to be performed at a relatively high rate, but the maximum rate is limited by the clock rate at which data is shifted through the X and Y shift registers. The maximum rate is thus a function of the complexity of the shift register design and the delay of the elements used in that design. Due to the ever increasing demands for higher and higher sampling rates, the limitation imposed by the X and Y shift registers is no longer acceptable. What is desired is an analog acquisition system that is not limited by the maximum clock rate of a shift register.

SUMMARY OF THE INVENTION

An analog acquisition system according to the present invention includes an array of analog capture cells for capturing and storing a signal on an analog bus. Each capture cell in the array may be sequentially selected for sampling the signal at successive sample times. Timing for selecting a row of the analog memory array is provided by a slow shift register and timing for selecting a capture cell within the row of the analog memory array is provided by a fast tapped delay line. Additional circuitry is provided for controlling the delay of the tapped delay line such that total delay is equal to the time the slow shift register takes to transfer from one row to the next. Therefore the sampling rate is determined by the delay from one tap to the next on the tapped delay line and is not limited by the clock rate of a shift register.

One advantage of the present invention is that analog signals can be sampled at very high rates exceeding one gigasample per second.

Another advantage of the present invention is that it can be fabricated in a relatively inexpensive CMOS integrated circuit process.

The foregoing and other objects, features and advantages of the invention are more readily apparent from the following detailed description of a preferred embodiment which proceeds with reference to the drawings.

BRIEF DESCRIPTION OF THE DRAWINGS

FIG. 101 is a timing diagram for the ring oscillator tapped delay line of FIG. 9;

FIG. 18 is a table of shift register contents used to selectively enable and disable a capture cell having an enable input;

DETAILED DESCRIPTION OF A PREFERRED EMBODIMENT

Figure 1:
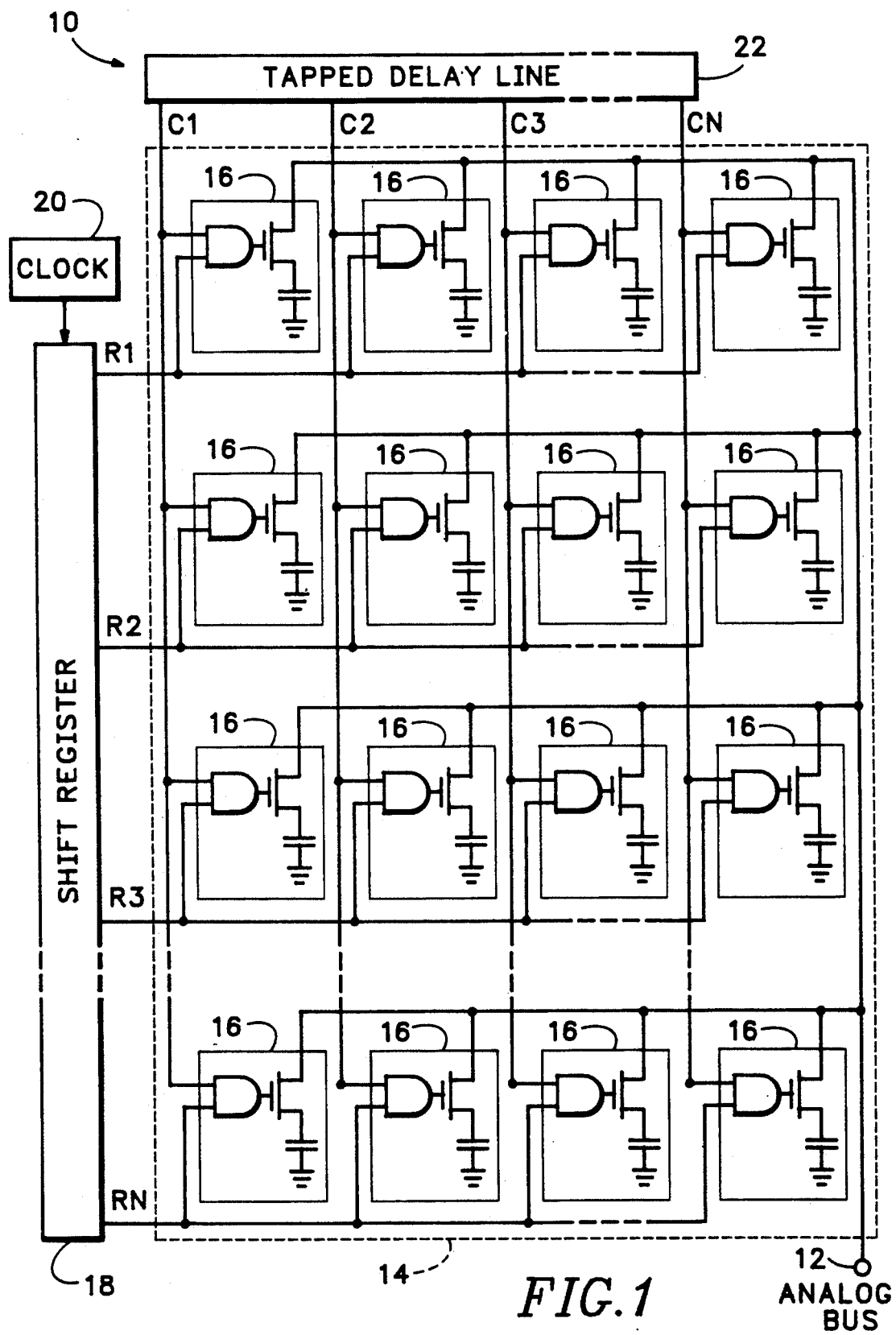
FIG. 1 is a functional block diagram of a first embodiment of an analog acquisition system according to the present invention.

A functional block diagram of a high speed analog acquisition system according to the present invention is shown in FIG. 1. An analog acquisition system 10 includes an analog bus 12 for receiving the signal to be acquired. An analog memory array 14 includes analog capture cells 16 for capturing and storing a signal on the analog bus 12. Each capture cell 16 has an analog input coupled to the analog bus 12 and first and second digital inputs. The analog capture cells 16 are arranged into a plurality of columns and rows, wherein each column has an associated column input designated C1 through CN that is coupled to the first digital input of each analog capture cell 16 in the column, and wherein each row has an associated row input designated R1 through RN coupled to the second digital input of each analog capture cell 16 in the row. The analog acquisition system further includes a shift register 18 that has an input for receiving a clock signal 20 and a plurality of shifted outputs coupled to the row inputs R1 through RN of the analog memory array. A tapped delay line 22 has a plurality of strobe outputs coupled to the column inputs C1 through CN of the analog memory array 14.

Figure 2:
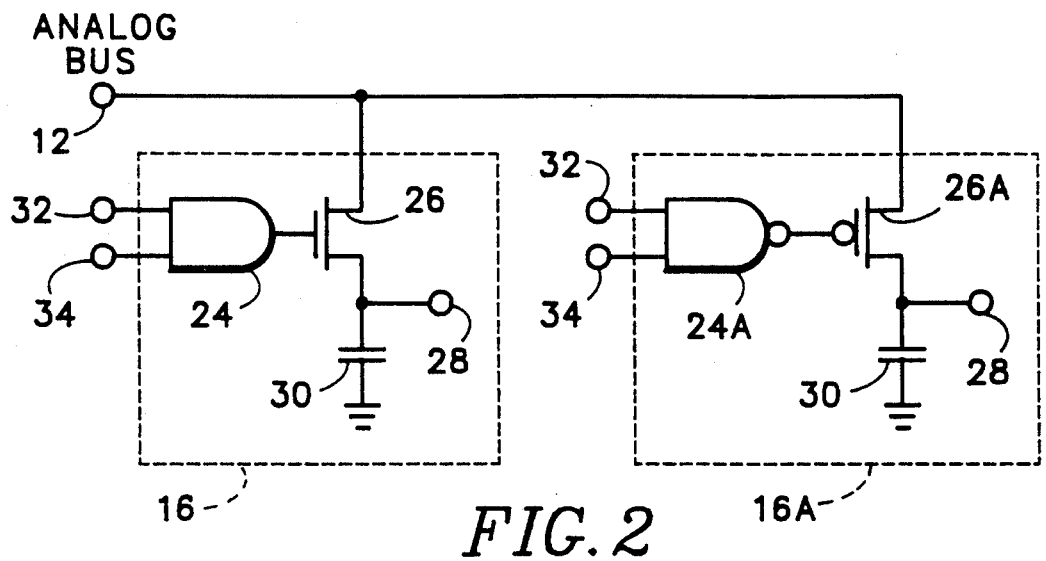
FIG. 2 is a schematic diagram of two embodiments of an analog capture cell.

An individual capture cell 16 of the analog acquisition system 10 is shown in greater detail in FIG. 2. Each capture cell 16 includes an n-channel FET transistor 26 having a source, a gate, and a drain coupled to the analog bus 12. An AND gate 24 has one input 32 coupled to a column line, another input 34 coupled to a row line, and an output coupled to the gate of the n-channel FET transistor 26. A storage element such as capacitor 30 is coupled to the source of the n-channel FET transistor 26 for storing a captured signal at storage terminal 28. An alternative capture cell 16A is also shown in detail in FIG. 2. Each alternative capture cell includes a NAND gate 24A in place of AND gate 24 and a p-channel FET transistor 26A in place of n-channel FET transistor 26. The circuit connections and input/output assignment are the same as in capture cell 16.

In operation, the signal that is to be acquired is applied to the drain of the n-channel FET transistor 26 in capture cell 16 through the analog bus 12. When the gate of transistor 26 is energized the transistor conducts and a low impedance path is formed from the drain to the source. Thus, the signal on the analog bus is passed from the drain of transistor 26 to the source and charges capacitor 30. When the gate of transistor 26 is de-energized the transistor is off and a high impedance path is formed from the drain to the source. Subsequently, the voltage of the analog signal is stored on the capacitor 30 at storage terminal 28 and is isolated from any further changes of the signal on the analog bus 12.

Figure 2A:
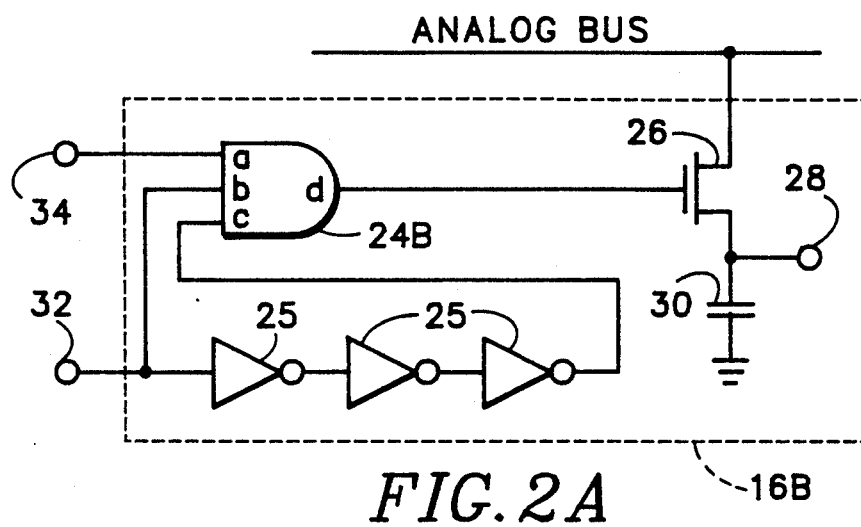
FIG. 2A is a schematic diagram of an analog capture cell having a pulse generation feature.
Figure 2B:
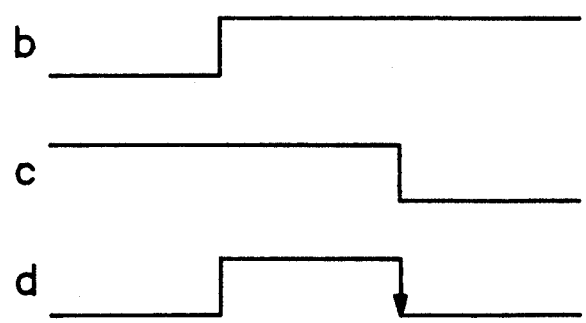
FIG. 2B is a timing diagram for the capture cell shown in FIG. 2A.

Transistor 26 of capture cell 16 is turned on and off by the change of logic states of digital inputs 32 and 34 and AND gate 24. If a pulse of appropriate polarity is presented to one of the inputs 32 or 34, FET transistor 26 conducts for only a short amount of time. This may be desirable in order that an accurate instantaneous sample is acquired and that the analog bus is not loaded by many capture cells 16 conducting at the same time. However, in some applications it may be desirable to generate a pulse from only the edge of a logic signal presented to inputs 32 or 34. Therefore, another alternative capture cell 16B is shown in FIG. 2A. In this capture cell, the AND gate 24 of FIG. 2 has been replaced by a three input AND gate 24B. Input 32 is directly coupled to AND gate 24B and indirectly coupled through three serially connected inverter gates 25. The timing diagram for capture cell 16B is shown in FIG. 2B. If input terminal 34 is held high (AND input "a") and a positive going edge is presented to input terminal 32 (AND input "b"), a delayed negative going edge is provided at AND input "c". The AND output "d" is a pulse with a width determined by the delay through the three inverter gates 25. The narrow pulse at output "d" determines the amount of time that capture cells 16B samples the signal on the analog bus 12 and is provided through a single edge at input terminal 32.

Thus, the capture cells 16 may be placed in a two dimensional analog memory array 14 with appropriate control logic inputs that causes an analog signal to be captured in the capture cells 16 from left to right in each row and then from top to bottom through the entire array. Referring back to FIG. 1, the row logic signals on row input lines R1 through RN are provided by a shift register 18 coupled to a clock 20. Each row line is selectively energized at intervals of one clock period as the clock pulse ripples down through the shift register 18. The clock logic signals on clock input lines C1 through CN are provided by a tapped delay line 22 that provides a propagating edge to each of the capture cells 16. Since the propagation delay of the tapped delay line 22 can be less than 500 picoseconds, the analog signal on the analog bus 12 can be captured at rates exceeding one gigasample per second.

Figure 3:
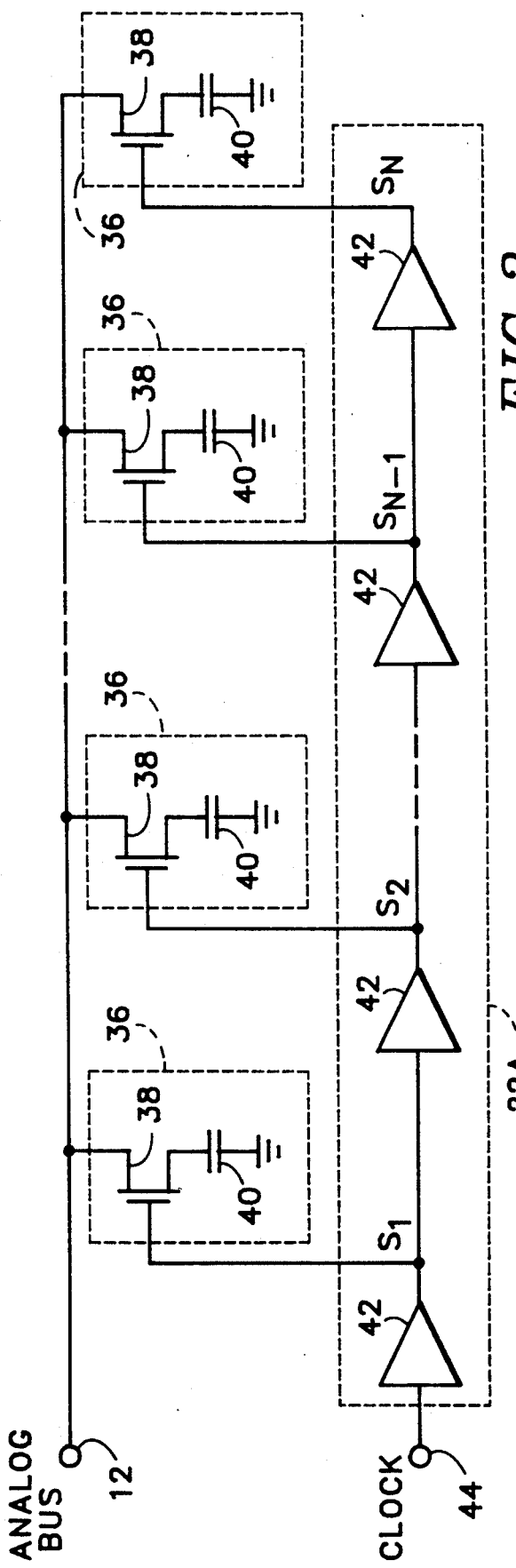
FIG. 3 is a schematic diagram showing one embodiment of a tapped delay line in relationship with one row of analog capture cells.
Figure 4:
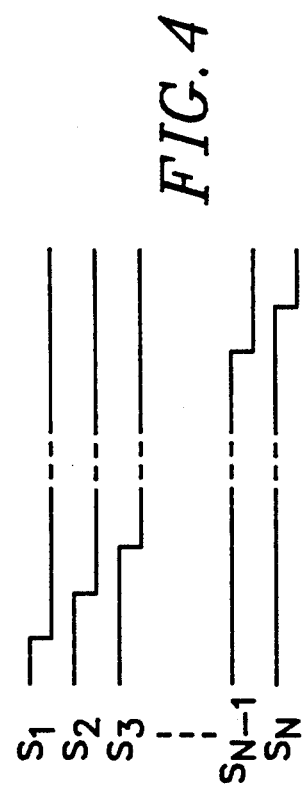
FIG. 4 is a timing diagram for the tapped delay line shown in FIG. 3.

One embodiment of the tapped delay line 22 is shown in greater detail in FIG. 3. The tapped delay line 22A includes a plurality of serially coupled buffer stages 42, each buffer stage having an input and an output coupled to the input of the next buffer stage in the series. The input of the first buffer stage receives the clock signal 44 and the output of each of the buffer stages S1 through SN provides a strobe output. The strobe outputs are coupled to a row of simplified capture cells 36 including a capacitor 40 and an FET transistor 38 coupled to the analog bus 12. The timing diagram for the tapped delay of FIG. 3 is shown in FIG. 4. The negative going edge of the clock signal 44 propagates through each buffer stage 42 causing each capture cell 36 in turn to sample the signal on the analog bus 12. The delay between subsequent strobe signals is determined by the delay through each buffer stage 42.

Figure 5:
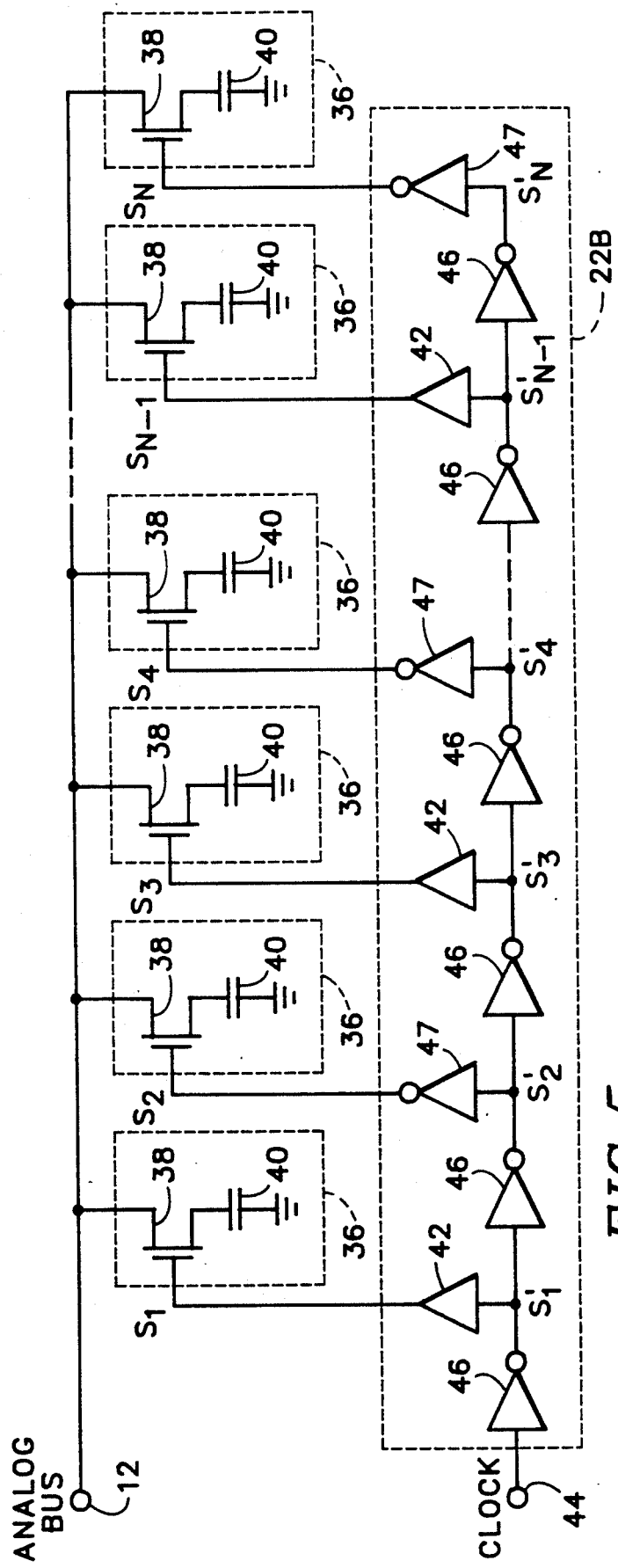
FIGS. 5-7 are schematic diagrams showing an alternative embodiment of a tapped delay line in relationship with one row of analog capture cells.

The strobe signals S1 through SN may be provided by several different embodiments of a tapped delay line. A tapped delay line 22B is shown in FIG. 5 including a plurality of serially coupled first inverter stages 46, each stage having an input and an output coupled to the input of the next first inverter stage in the series. The input of the first inverter stage 46 receives the clock signal 44 and the output of each of the first inverter stages forms a series of odd (S1', S3', . . . ) and even numbered terminals (S2', S4', . . . ). The odd numbered terminals are coupled to the input of a buffer stage 42 and the even numbered terminals are coupled to the input of a second inverter stage 47. The output of each of the buffer stages 42 and the second inverter stages 47 provides a strobe output to simplified capture cells 36.

Figure 6:
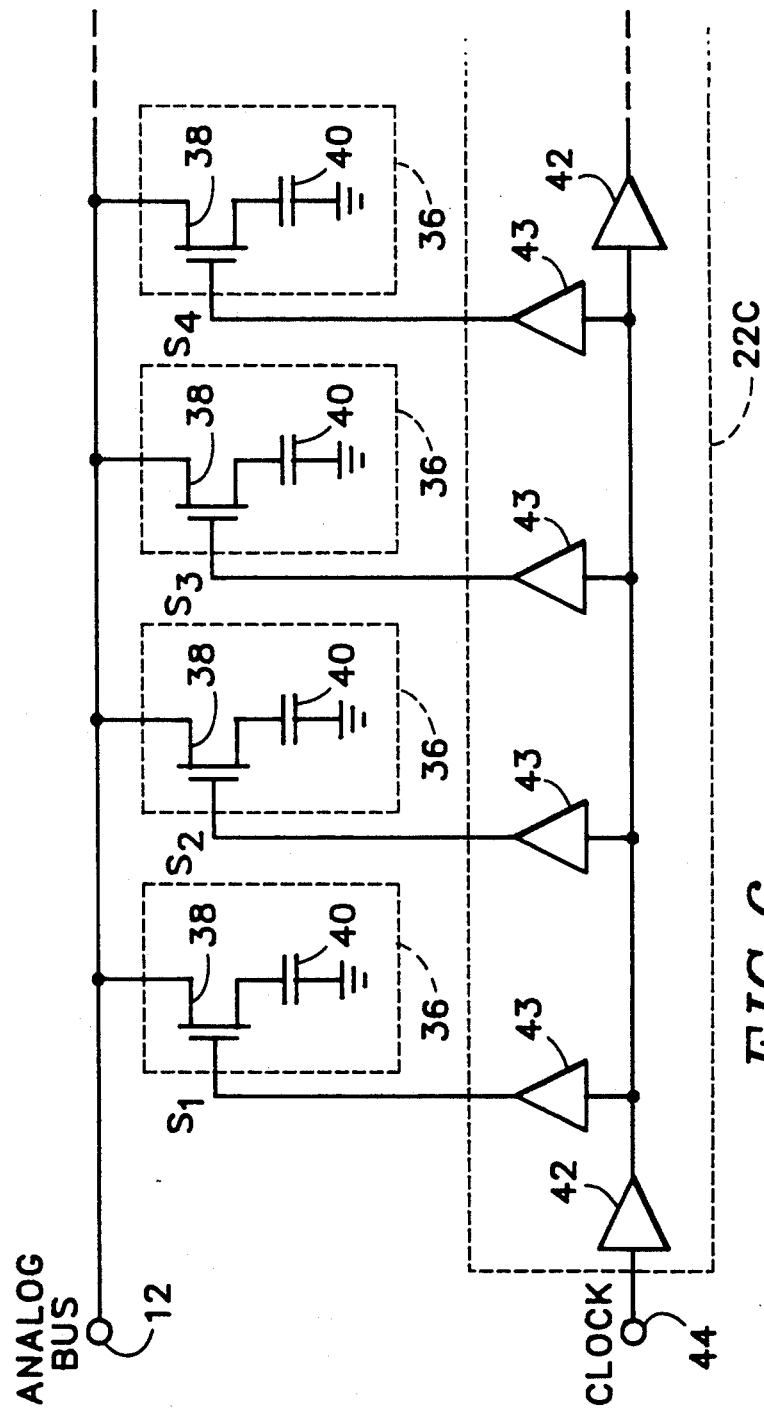

A tapped delay line 22C is shown in FIG. 6 including a plurality of serially coupled first buffer stages 42, each buffer stage having an input and an output coupled to the input of the next buffer stage in the series. The input of the first buffer stage 42 receives the clock signal 44 and the output of each of the buffer stages 42 forms an intermediate terminal coupled to the input of N second buffer stages 43. The output of each second buffer stage 43 provides a strobe output S1 through SN to simplified capture cells 36. In operation, the delay of the second buffer stages is progressively increased to provide proper strobe timing. Thus, the delay of the first of the N second buffer stages 43 has a delay equal to a predetermined minimum delay, the second of the N second buffer stages 43 has a delay greater than the predetermined minimum delay, and the delay of each of the successive second buffer stages 43 is increased until the last of the N second buffer stages has a delay equal to a predetermined maximum delay.

Figure 7:
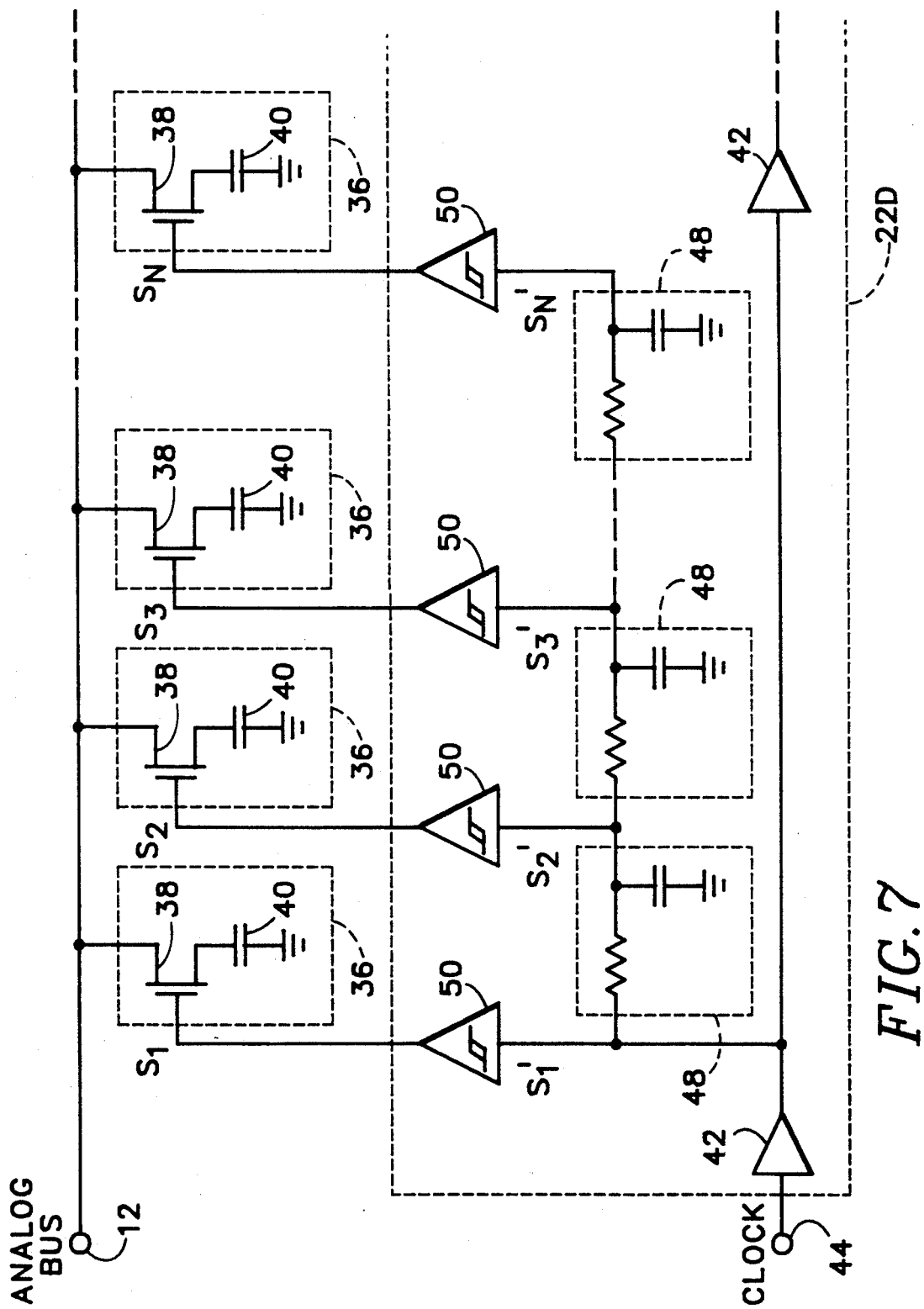

A tapped delay line 22D is shown in FIG. 7 in which the progressively increasing delay of tapped delay line 22C is provided by a distributed RC network. Tapped delay line 22D includes a plurality of serially coupled buffer stages 42, each buffer stage having an input and an output coupled to the input of the next buffer stage 42 in the series. The input of the first buffer stage receives the clock signal 44 and the output of each of the buffer stages 42 forms an intermediate terminal. Each intermediate terminal is in turn coupled to the input of a second tapped delay line having N output terminals S1' through SN' and each output terminal is coupled to the input of a second buffer stage 50. The output of each second buffer stage 50 provides a strobe output S1 through SN to simplified capture cells 36. The value of the delay associated with each of the N output terminals S1' through SN' of the second tapped delay line ranges equally between a predetermined minimum delay and a predetermined maximum delay. As shown in FIG. 7, the second tapped delay line includes a cascaded series of resistor and capacitor low pass filter sections 48. One low pass filter section 48 determines the minimum delay. The maximum delay of the second tapped delay line is determined by the number of low pass filter sections 48 used.

Figure 8:
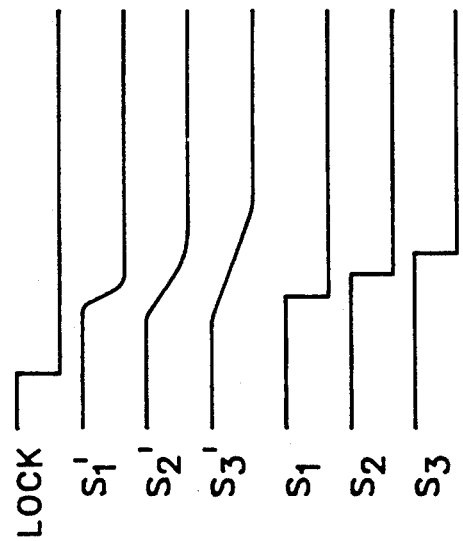
FIG. 8 is a timing diagram for the tapped delay line shown in FIG. 7.

To aid in the understanding of the operation of tapped delay line 22D, a corresponding timing diagram is provided in FIG. 8. The clock input signal 44 is shown as negative going edge that propagates through the low pass filter sections 48 of tee second delay line. Thus, the signal edge is both delayed and filtered at output terminals S1' through S3'. The signal at these outputs is further processed by the second buffer stages 50. It is desirable that a Schmitt trigger buffer stage is used for each buffer stage 50. In this way, the sharp edge of the propagating clock signal will be restored and the proper delay between strobe signals at terminals S1 through SN will be maintained.

Figure 9:
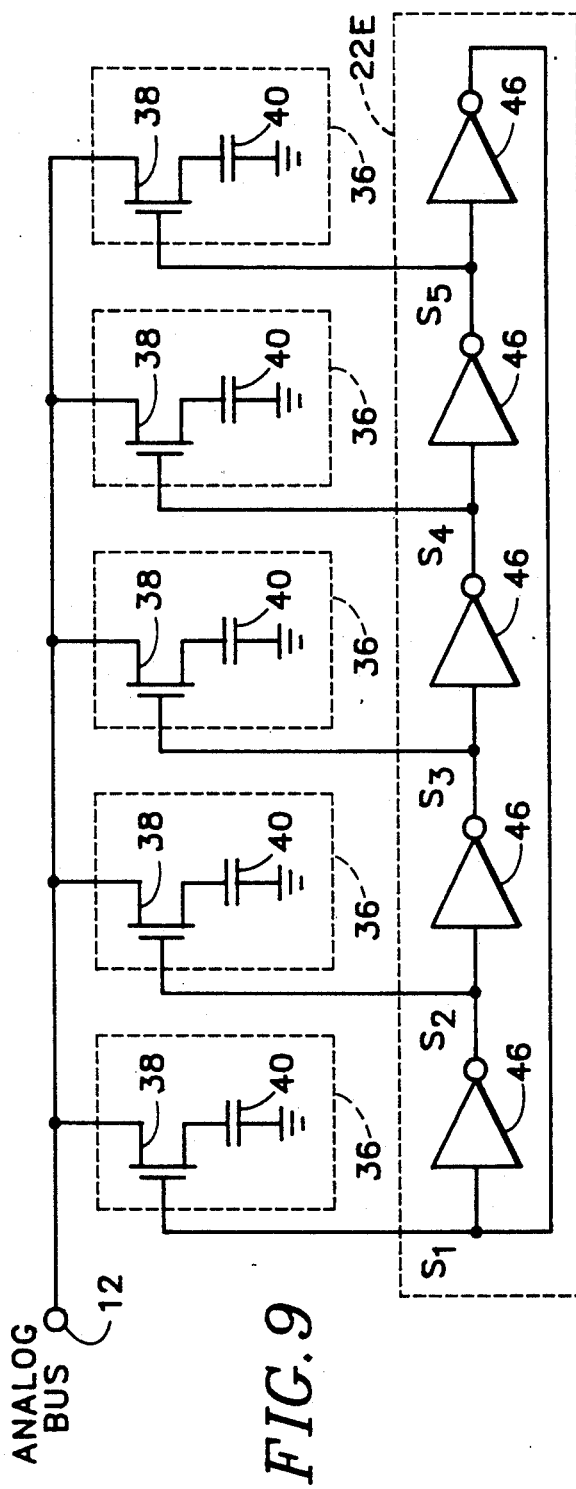
FIG. 9 is a schematic diagram of a ring oscillator tapped delay line.
Figure 10:
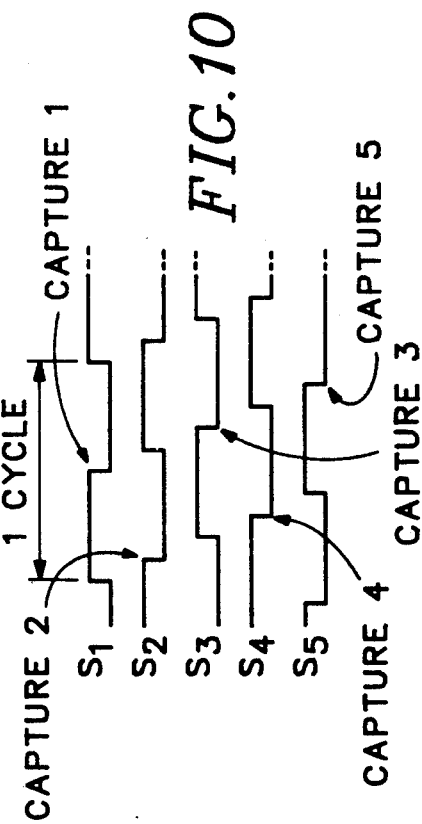

Still another embodiment of the tapped delay line generates a propagating edge without a clock input. A ring oscillator tapped delay line 22E is shown in FIG. 9. Tapped delay line 22E includes an odd numbered plurality of serially coupled inverter stages 46. An odd number is necessary in order to generate an oscillating clock signal at a frequency related to the delay through one inverter stage 46. Each inverter stage 46 has an input and an output coupled to the input of the next inverter stage in the series. The output of the last inverter stage 46 is coupled to the input of the first inverter stage to form an oscillating ring of inverter stages 46. The output of at least one of the inverter stages may be used to provide a strobe output to capture cells 36 shown in simplified form. In tapped delay lines 22A through 22D, the capture of an analog signal occurred sequentially through each tap of the delay from left to right. Since each inverter stage 46 of the ring oscillator inverts the edge of the propagating clock signal, acquisition of the analog signal occurs sequentially through every other inverter stage 46. A corresponding timing diagram is provided in FIG. 10 that shows the capture sequence. The signal is first captured at the time corresponding to the signal edge at terminal S2 followed by S4, S1, S3, and S5. Since there are five inverter stages in the delay line 22E of FIG. 9, the capture cycle described above repeats once every clock cycle.

Figure 9A:
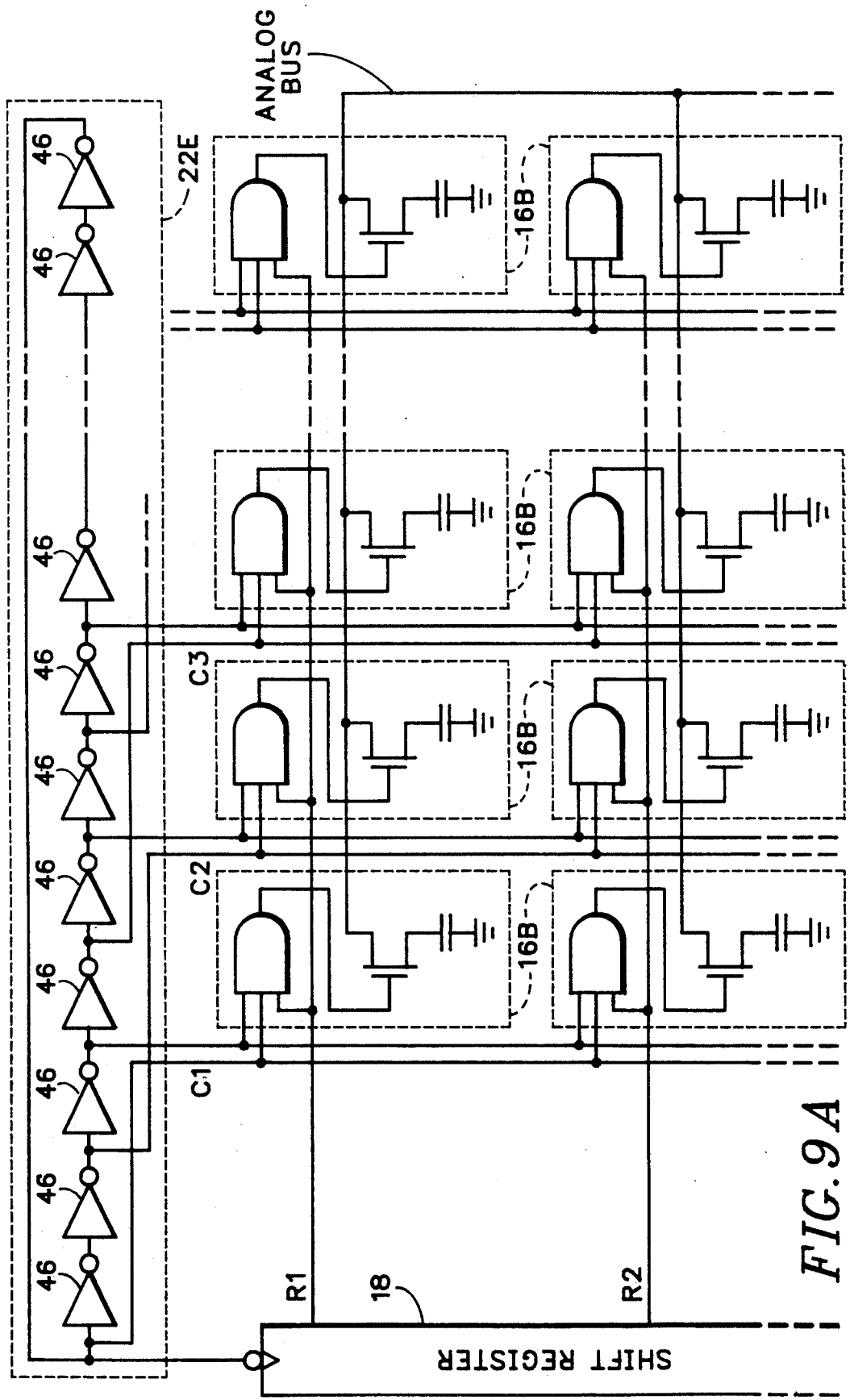
FIG. 9A is a schematic diagram of a ring oscillator tapped delay line and a portion of a capture cell array wherein the taps are used to generate strobe pulses.

The ring oscillator 22E shown in FIG. 9 may be used with an analog memory array to create acquisition pulses and eliminate the need for individual inverter stages within the capture cell as shown in FIG. 2A. Thus, FIG. 9A shows an expanded ring oscillator tapped delay line 22E showing taps used to generate a positive and negative going edge to provide a pulse to the gate of the FET transistor in the simplified capture cell 16B. For example, the input to the first inverter stage 46 and the output of the third inverter stage 46 are combined in the AND gate of each capture cell 16B in the first column of the memory array. The positive and negative going edges are logically ANDed to create a narrow pulse that enables the capture cell 16B to capture the signal on the analog bus 12 for only a short time.

Although the delay from one tap to another in the delay lines described above can be made to be extremely short, one problem associated with the delay lines 22A-22E described above is that the delay through the entire delay line is not precisely controlled. Referring back to FIG. 1, the reason this is a problem is that the delay through the entire delay line 22 must be equal to exactly one clock cycle of the clock used to sequence the shift register 18. In order to sample and acquire the input signal at regular intervals throughout the entire acquisition period it is necessary that the acquisition along the first row of capture cells be completed as the shift register 18 enables the next row of capture cells. Therefore in order to accomplish precise sampling, the analog acquisition system 10 in FIG. 1 further includes a means for adjusting the delay through the entire tapped delay line 22 to equal one clock cycle. One manner in which this may be accomplished is through a delay voltage input, wherein the delay of the tapped delay line 22 is proportional to a voltage applied to the delay voltage input.

Figure 11A:
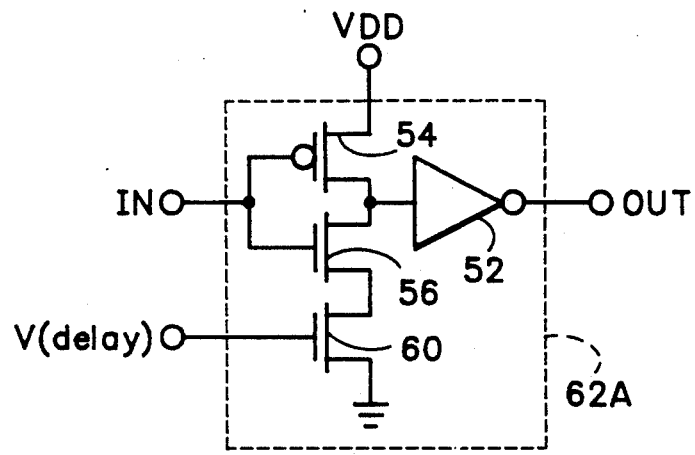
FIGS. 11A-11E are schematic diagrams of alternative embodiments of a buffer stage including an adjustable delay feature.

Five such alternatives for adjusting the delay of the tapped delay line 22 are shown in FIGS. 11A-11E. Referring back to FIG. 3, one embodiment of a tapped delay line 22A includes a plurality of serially coupled buffer amplifiers 42. In FIG. 11A, a buffer amplifier 62A having a delay voltage input is shown in detail. Buffer amplifier 62A is suitable to replace each buffer amplifier 42 in FIG. 3 to create a delay line wherein the total delay through the delay line is adjustable. The buffer amplifier 11A includes an inverter stage with a delay voltage input designated V(delay). The delay adjustable inverter stage includes a p-channel FET transistor 54 having a gate that forms the input of the inverter and a drain that forms the output. The source of p-channel FET transistor 54 is coupled to a power supply voltage designated VDD. A first n-channel FET transistor 56 has a gate coupled to the input, a drain coupled to the output, and a source. A second n-channel FET transistor 60 has a gate coupled to the delay voltage input designated V(delay) and a drain coupled to the source of the first n-channel FET transistor 56. The coupled drains of FET transistors 54 and 56 are in turn coupled to the input of a nonadjustable inverter stage 52 to provide a noninverted output for buffer stage 62A.

Figure 11B:
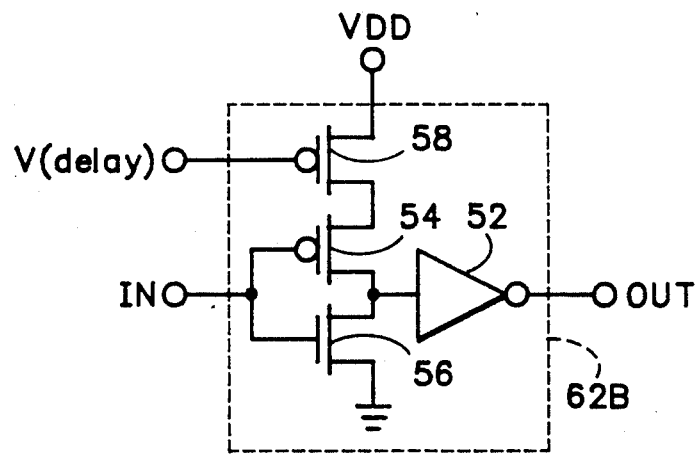

Another embodiment, adjustable buffer amplifier 62B is shown in detail in FIG. 11B. An adjustable inverter stage includes a first p-channel FET transistor 54 having a gate that forms the input, a drain coupled to the output, and a source. An n-channel FET transistor 56 has a gate coupled to the input and a drain coupled to the output. A second p-channel FET transistor 58 has a gate coupled to the delay voltage input V(delay), a source coupled to the power supply voltage VDD, and a drain coupled to the source of the first p-channel FET transistor 54. As in the previous embodiment of FIG. 11A, the output of the adjustable inverter stage is coupled to the input of a nonadjustable inverter stage 52 to form a noninverted output. In the embodiments of FIGS. 11A and 11B it is important to note that the current requirements of the adjustment voltage V(delay) are nominal since this voltage drives the high impedance gate of an FET transistor.

Figure 11C:
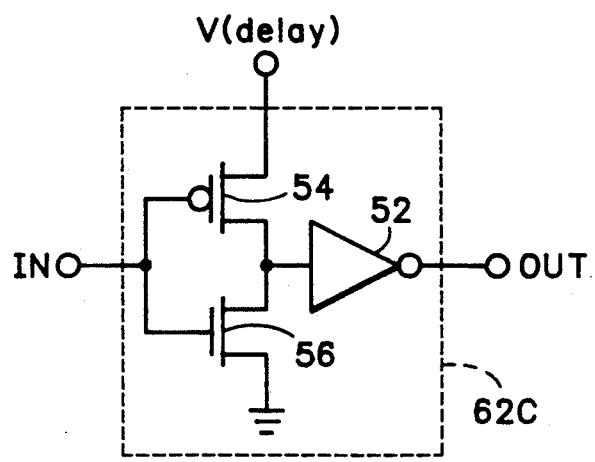

Yet another embodiment, adjustable buffer amplifier 62C is shown in detail in FIG. 11C. In a simpler design, the adjustable inverter stage includes a single p-channel FET transistor 54 having a gate forming the input, a drain coupled to the output and a source coupled to the delay voltage input designated V(delay). A single n-channel FET transistor 56 has a gate coupled to the input and a drain coupled to the output. As in the previous two embodiments, nonadjustable inverter 52 provides a noninverted input. However, unlike the previous two embodiments, the current requirements of the adjustment voltage V(delay) must be considered. If the design of FIG. 11C is used, adjustment voltage V(delay) must have enough current capacity to drive the current through an FET transistor times the total number of transistors used in the delay line. If the adjustment voltage V(delay) is less than $VDD-V_{tp}$ (the threshold voltage of a p-channel FET transistor), then a DC current may flow through the nonadjustable inverter 52, increasing total power consumption.

Figure 11D:
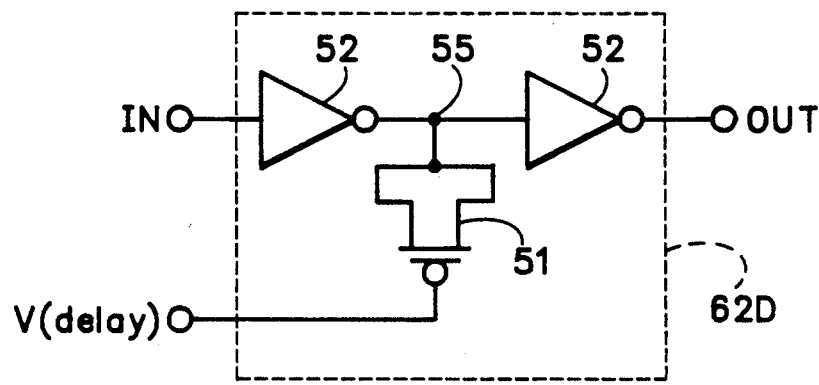

Yet another embodiment, adjustable buffer amplifier 62D is shown in detail in FIG. 11D. The adjustable buffer amplifier 62D includes two nonadjustable inverter stages 52 serially coupled at node 55 and a nonlinear voltage adjustable capacitor provided by a p-channel FET transistor 51. The drain and source of transistor 51 are coupled together and to the junction of the two nonadjustable inverter stages 52 at node 55. The delay voltage input designated V(delay) modulates the gate voltage and thus the capacitance of transistor 51, which in turn modulates the total delay through the adjustable buffer amplifier 62D.

Figure 11E:
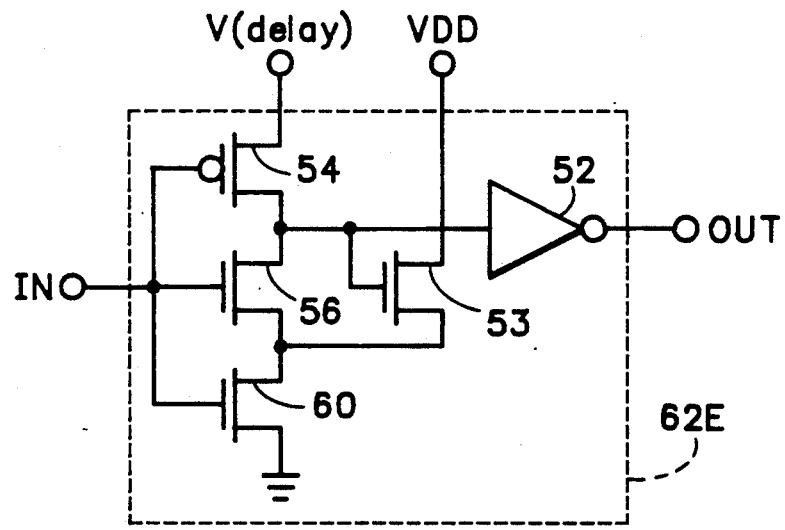

Yet another embodiment, an adjustable Schmitt trigger buffer amplifier 62E, is shown in detail in FIG. 11E. The buffer amplifier 11E includes an inverter stage with a delay voltage input designated V(delay). The delay adjustable inverter stage includes a p-channel FET transistor 54 having a gate that forms the input of the inverter and a drain that forms the output. The source of p-channel FET transistor 54 is coupled to the delay voltage input designated V(delay). A first n-channel FET transistor 56 has a gate coupled to the input, a drain coupled to the output, and a source. A second n-channel FET transistor 60 has a gate coupled to the input and a drain coupled to the source of the first n-channel FET transistor 56. The coupled drains of FET transistors 54 and 56 are in turn coupled to the input of a nonadjustable inverter stage 52 to provide a noninverted output for buffer stage 62E. Feedback from the drain of FET transistor 56 to the drain of FET transistor 60 is provided by an FET transistor 53.

The addition of an adjustment voltage to the buffer amplifiers and thus to the entire delay line eliminates the need to characterize the timing of each delay line. Thus, if the analog acquisition system of the present invention is manufactured on an integrated circuit, the adjustment voltage may be used to adjust the value of the delay to some constant desired value determined by the clock signal used by the shift register. Other alternatives may be used to control the timing of the delay line including varying the temperature of the transistors or by varying the load on the input or internal nodes of the buffers in the delay line. Also, a multiplexer could be used to switch between buffers or inverters having varying amounts of delay.

Figure 12:
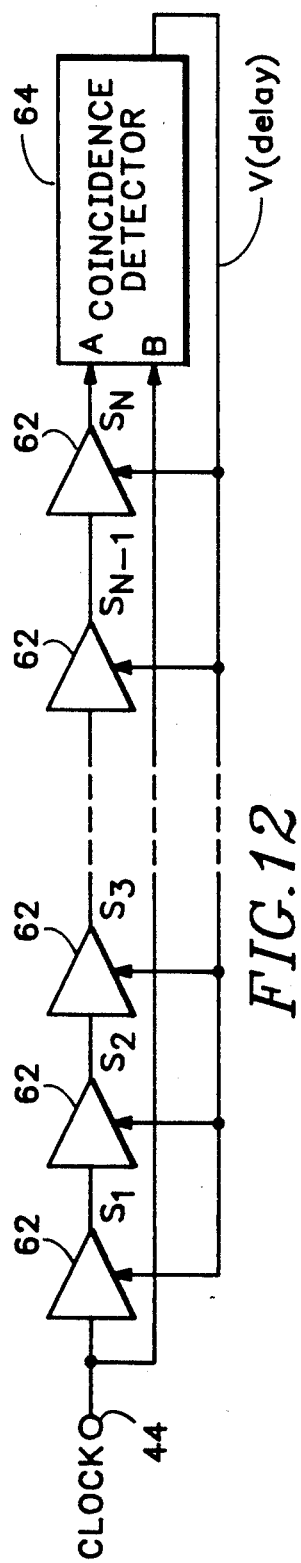
FIG. 12 is a functional block diagram of a delay adjustable tapped delay line coupled to a coincidence detector.

Therefore, the timing of the delay line is measured and errors (total delay through the delay line not equal to one clock cycle) are corrected through the voltage adjustment input on each buffer amplifier. In FIG. 12, a clock is coupled to the input of the first buffer amplifier in a string of buffer amplifiers 62. When the proper delay through the string of buffers is achieved, the rising edge of the clock arrives at the input to the first buffer at precisely the same time as the previous rising edge leaves the last buffer. The output of the last buffer in the string and the clock are coupled to a detector. The detector determines which signal arrives first and then provides an appropriate change in the adjustment voltage V(delay) necessary to correct the timing error. Thus FIG. 12 shows a coincidence detector 64 having a first input A for receiving a clock signal 44 passed through the tapped delay line (buffer stages 62), a second input B for directly receiving the clock signal, and an output for providing a control voltage V(delay) that is proportional to the difference between the direct and delayed clock signals at the first and second inputs. The output is coupled to the delay voltage input of the buffer stages 62 of the tapped delay line in order to change the delay of the delay line and correct any timing errors.

Figure 13:
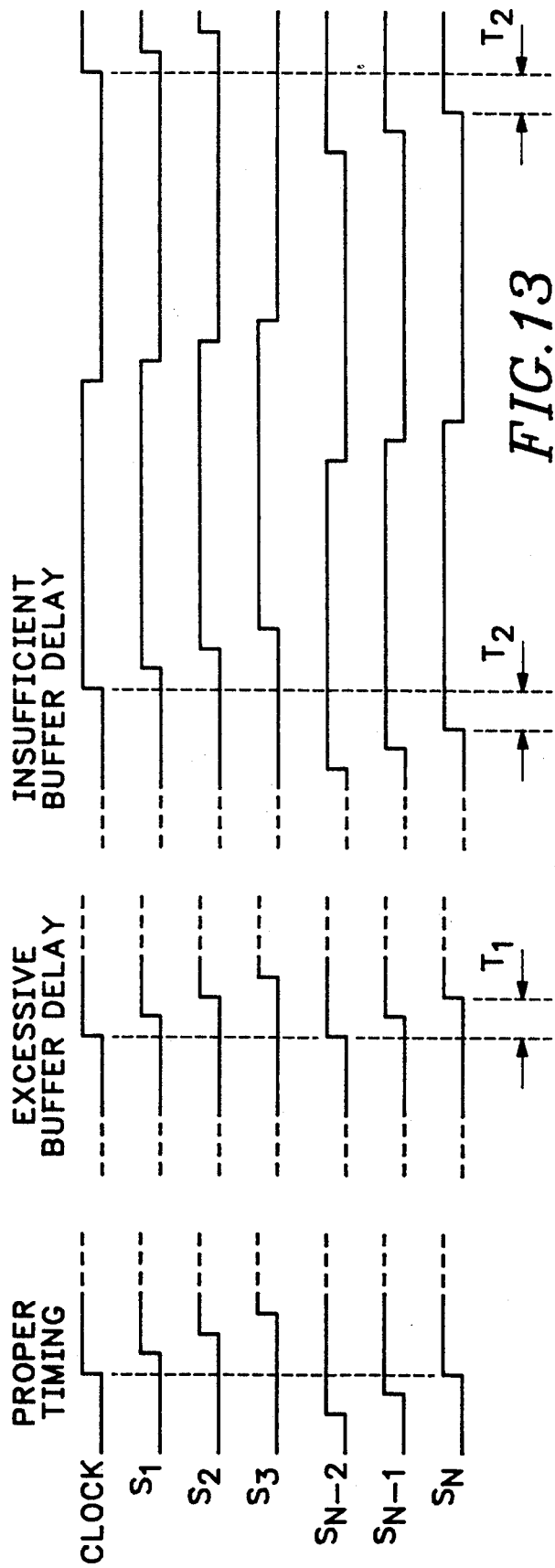
FIG. 13 is a timing diagram for the functional block diagram of FIG. 12.

The timing of the delay line shown in FIG. 12 is illustrated in FIG. 13. The voltage waveforms of the clock signal 44 and those at the buffer output terminals S1 through SN are displayed for proper timing, excessive buffer delay, and insufficient buffer delay. In the case of proper timing through the delay line, the clock edge of the clock arrives at input B of the detector at the same time as the previous clock edge arrives at input A of the detector. Note the relative position of the clock and SN waveforms. In the case of excessive buffer delay, the waveform at terminal SN arrives too late by a period of time shown as T1. In the case of insufficient buffer delay, the waveform at terminal SN arrives too early by a period of time shown as T2.

Figure 14:
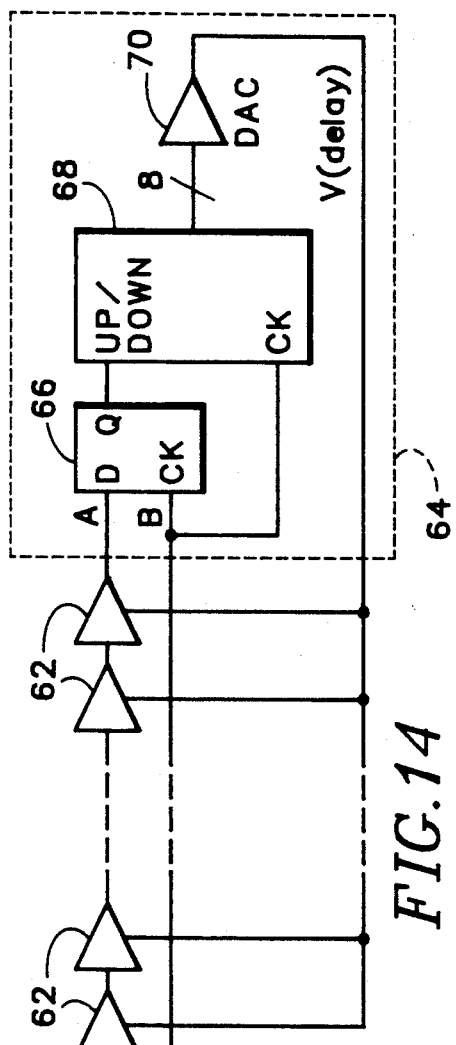
FIGS. 14, 15 and 15A are schematic diagrams of alternative embodiments of a coincidence detector.

The coincidence detector 64 of FIG. 12 is shown in greater detail in FIG. 14 and includes a D-type flip-flop 66 having a D input forming the A input, a clock input forming the B input, and a Q output. An up/down counter 68 has an up/down input coupled to the Q output of the D-type flip-flop 66, a clock input coupled to the B input, and an output. A digital to analog converter 70 has an input coupled to the output of the up/down counter 68 and an output for providing the control voltage V(delay). The output of the DAC 70 forms the output of the coincidence detector and is coupled to the delay voltage input of the delay line. In this embodiment, the D-type flip-flop 66 is clocked and captures the state of the output of the last buffer 62 at the time there is a rising edge on the clock signal 44. If the last buffer output is a logic zero, the chain of buffers 62 has excessive delay or is "slow". Conversely, if the last buffer output is a logic one, the chain of buffers 62 has insufficient delay or is "fast". When the D-type flip-flop 66 captures a logic zero, the counter 68 is decremented, otherwise the counter 68 is incremented. Thus, the output of the counter is converted into an analog voltage by DAC 70 to provide the appropriate delay adjustment voltage V(delay).

Figure 15:
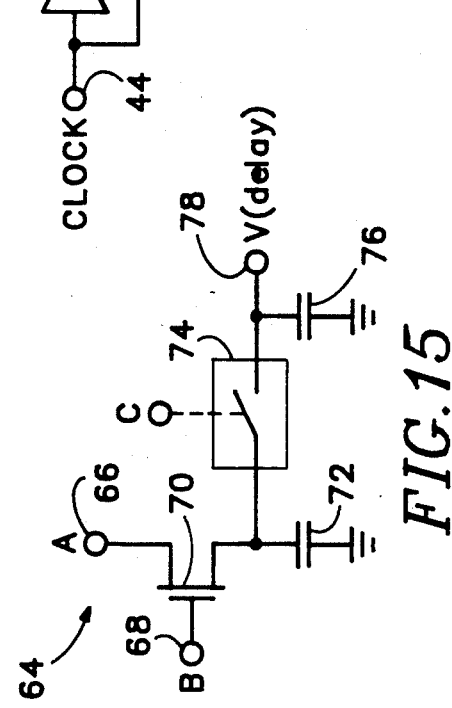

An alternative embodiment of the coincidence detector 64 of FIG. 12 is shown in FIG. 15 that includes an n-channel FET transistor 70 having a drain forming the A input, a gate forming the B input, and a first capacitor 72 coupled to the source of the n-channel FET transistor 70. A second capacitor 76 forms the output 78 of the coincidence detector, wherein the voltage stored on the second capacitor 76 provides the delay adjustment voltage V(delay). An electronic switch 74 is coupled between the first and second capacitors 72, 76 that is normally open and is closed after each clock cycle of the clock signal on switch terminal C. In operation, the first capacitor 72 is slightly charged if the delayed clock edge on input A is received before the direct clock edge on input B. After the clock edge is received on input B, the second capacitor 76 is briefly coupled to the first capacitor A through switch 74. While switch 74 is closed, charge sharing occurs between the capacitors and the delay adjustment voltage V(delay) is changed by a small amount.

Figure 15A:
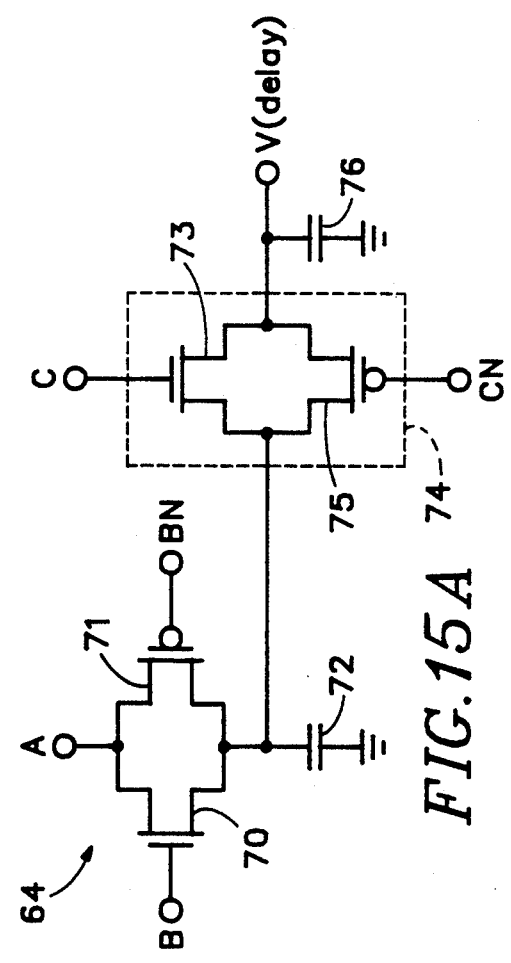

A more detailed schematic of the embodiment of the coincidence detector 64 shown in FIG. 15 is shown in FIG. 15A. The electronic switch 74 is shown as a parallel combination of an n-channel FET transistor 73 and a p-channel FET transistor 75. A p-channel FET transistor 71 is placed in parallel with n-channel FET transistor 70. For optimum performance, the p-channel devices may be necessary if the adjustment voltage V(delay) is close to VDD.

Switched capacitor circuits of the type shown in FIG. 15 can exhibit dithering, i.e. V(delay) alternates between too much delay adjustment and not enough delay adjustment. Making each delay change very small reduces timing error. Also, by choosing the correct capacitance for the storage capacitor in the capture cells the change in voltage of V(delay) can be made small enough so that the change in propagation delay through the entire buffer string is acceptably small.

Figure 16:
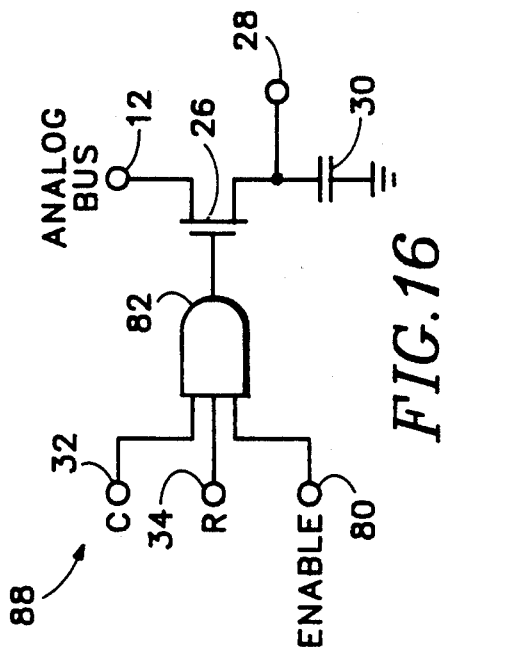
FIG. 16 is a schematic diagram of a capture cell having an enable input.

In some analog acquisition systems it may be desirable to change the capture rate over a wide range. One simple way to vary the capture rate is to vary the propagation delay of the buffers that comprise the tapped delay line. However, increasing the propagation delay of each buffer stage also increases timing errors. Another technique that does not introduce increasing timing errors adds a logic enable input to the analog capture cells. An analog capture cell with enable 88 is shown in FIG. 16 that includes an enable input 80 for selectively disabling the capture cell 88 from capturing and storing a signal in capacitor 30 at terminal 28. Thus the three input AND gate 82 includes the column input 32, the row input 34, and an additional enable input 80. The capture cell may be disabled for a predetermined number of clock cycles of the input clock signal, depending upon the effective capture rate desired, as explained below.

Figure 17:
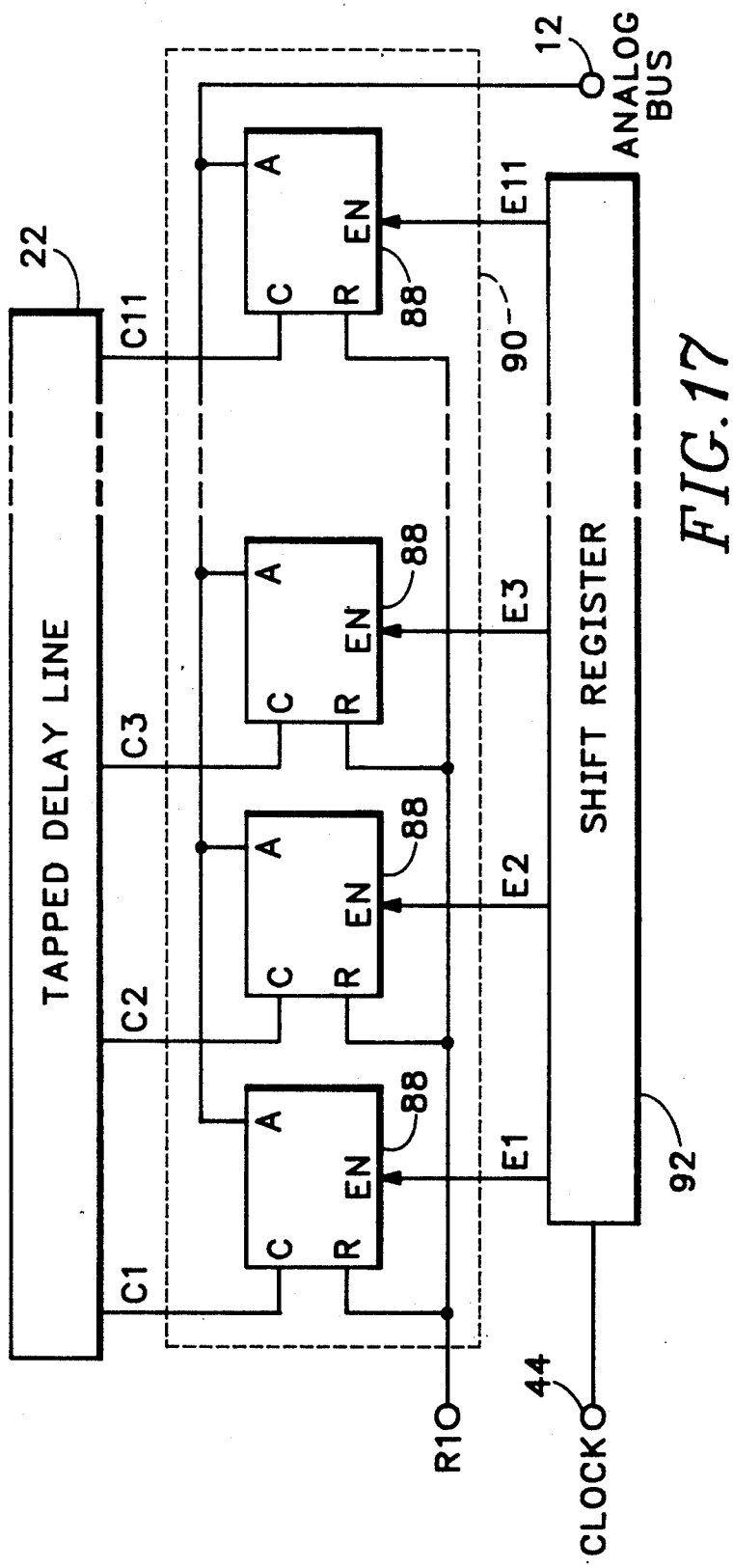
FIG. 17 is a functional block diagram of a row of capture cells having an enable input.

Eleven capture cells with an enable input 88 are shown in block diagram form in one row of an analog memory array 90 in FIG. 17. As before, tapped delay line 22 provides strobe outputs to the column inputs C1 through C11 of row 90. A row input R1 receives an input from a shift register (not shown). A second shift register 92 clocks a pattern of bits at the shift register outputs E1 through E11 to selectively enable or disable the respective capture cell 88 at the enable input EN.

When an input signal is captured at the fastest rate all of the capture cells 88 are enabled at all times. When capturing at one half of the fastest rate, all of the even numbered capture cells are enabled during one pass of the clock edge through the tapped delay line. During the next pass, the odd numbered capture cells are enabled. In this mode of operation, two cycles of the clock input are needed to acquire data in all of the capture cells 88. Therefore data is acquired at a rate that is half of the fastest rate. Note that the second shift register 92 must be pre-loaded with an alternating pattern of logic ones and zeroes to achieve the half rate acquisition. The pre-loaded pattern and pattern sequence for various samples rates are shown in FIG. 18. By loading the shift register with all logic ones, all of the capture cells are enabled for every pass of the clock edge through the tapped delay line. This results in the full sample rate shown in the top line. The pre-loaded pattern for the divide by two, five, and ten sample rates are also shown. The sequence of subsequent clocked patterns are shown below each pre-loaded pattern.

Figure 19:
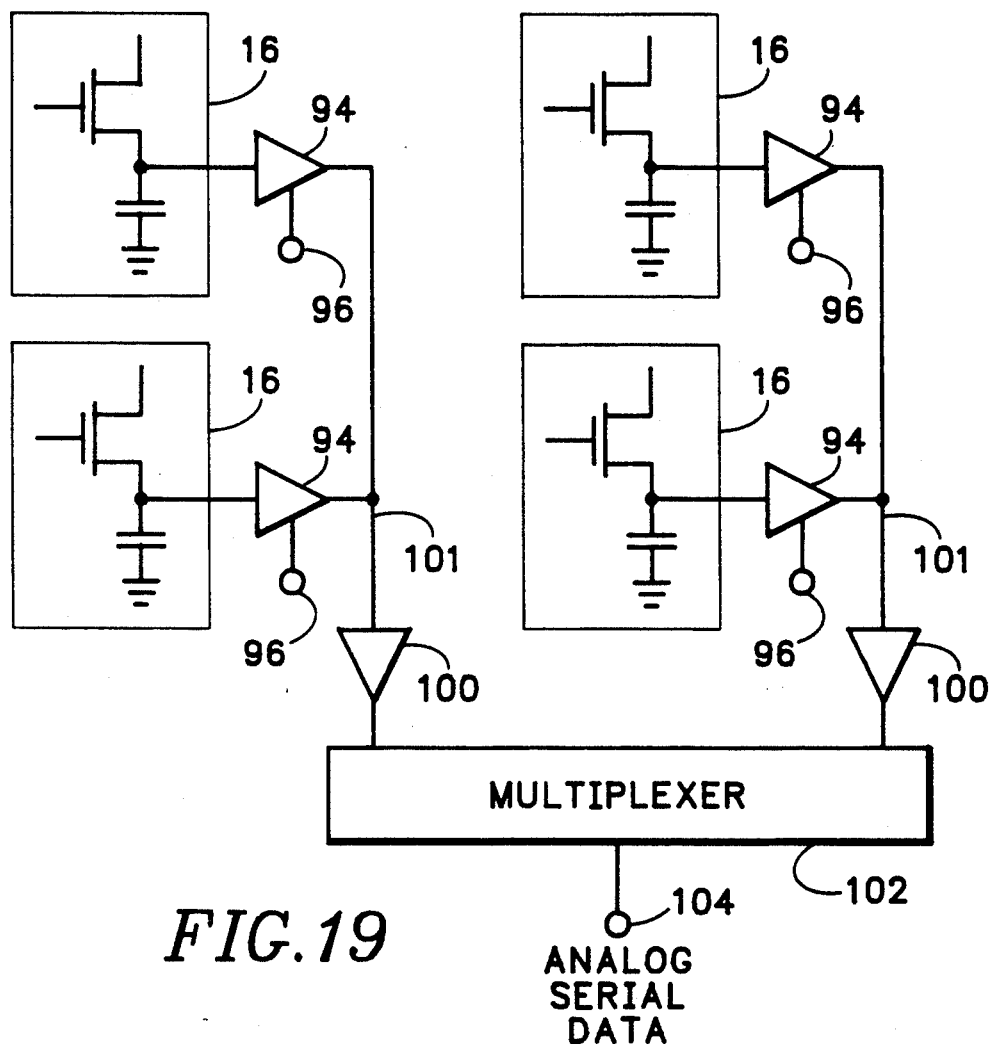
FIG. 19 is a schematic diagram of a read out circuit.

Once the data has been acquired by the capture cell, the analog data may be read out whenever it is convenient to do so using the reading out circuitry shown in FIG. 19. The read out circuitry includes a plurality of buffer stages 94 having an input coupled to the capacitor of the corresponding capture cell 16 and a separate enable input. A multiplexer 102 has a plurality of inputs coupled to the outputs of the buffer stages 94 through buffer stages 100. The output 104 of multiplexer 102 provides analog serial data. In operation, one row of buffer stages 94 is enabled through enable input 96. The voltage on the column line 101 is then sequentially selected by the multiplexer 102. After the data for the first row has been read out, the process is repeated using the next row of capture cells 16 to provide a complete sequence of serial data representing the original sampled waveform.

In the analog acquisition system 10 described in FIG. 1, the number of samples that could be stored depended upon the number of capture cells 16 used because each capture cell 16 contained only one storage element. To store more samples would require more capture cells. However, increasing the number of capture cells increases the capacitance of the analog bus 12. This is undesirable because the energy required to apply a high frequency signal to the bus increases as the capacitance increases, effectively limiting the bandwidth of the acquisition system.

Figure 20:
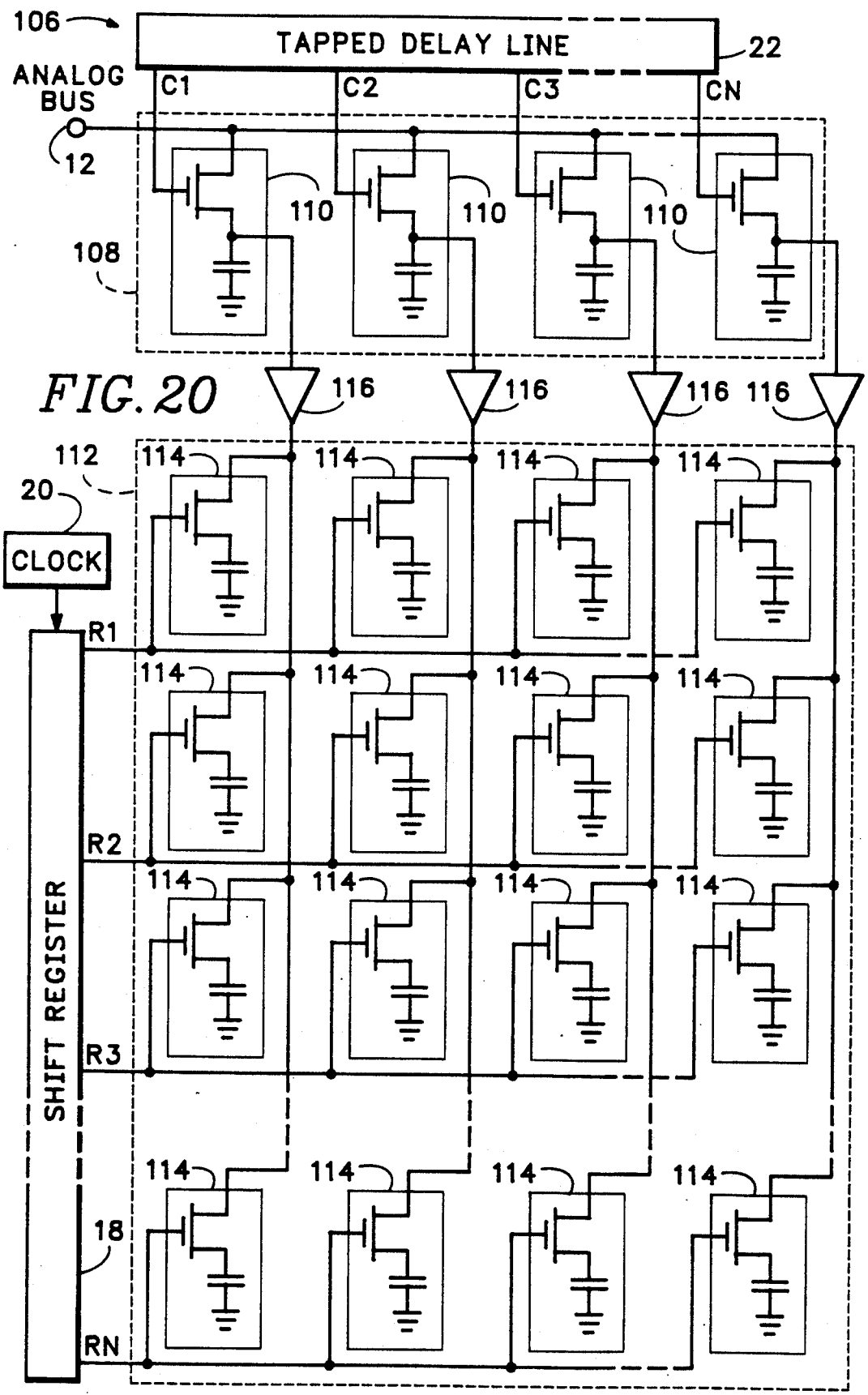
FIG. 20 is a functional block diagram of an alternative analog acquisition system for reducing capacitance of the analog bus.

An analog acquisition system 106 that reduces the capacitance on the analog bus 12 is shown in FIG. 20. The acquisition system 106 includes a row 108 of analog capture cells 110 for capturing and storing a signal on the analog bus 12. Each capture cell 110 has an analog input coupled to the analog bus 12, an analog output, and a digital input C1 through CN. An analog memory array 112 includes analog memory cells 114 for receiving and storing the signal captured by the analog capture cells 110. Each memory cell 114 has an analog input and a digital input, and the memory cells 114 are arranged in a plurality of columns and rows. Each column has an associated column input coupled to the analog input of each memory cell 114 in the column and to the analog output of the corresponding analog capture cell 110 through buffer stages 116. Each row has an associated row input R1 through RN coupled to the digital input of each memory cell in the row. A shift register 18 has an input for receiving a clock signal 20 and a plurality of shifted outputs coupled to the row inputs R1 through RN of the analog memory array 112. A tapped delay line 22 has a plurality of strobe outputs coupled to the digital inputs C1 through CN of the row of analog capture cells 108.

Figure 21:
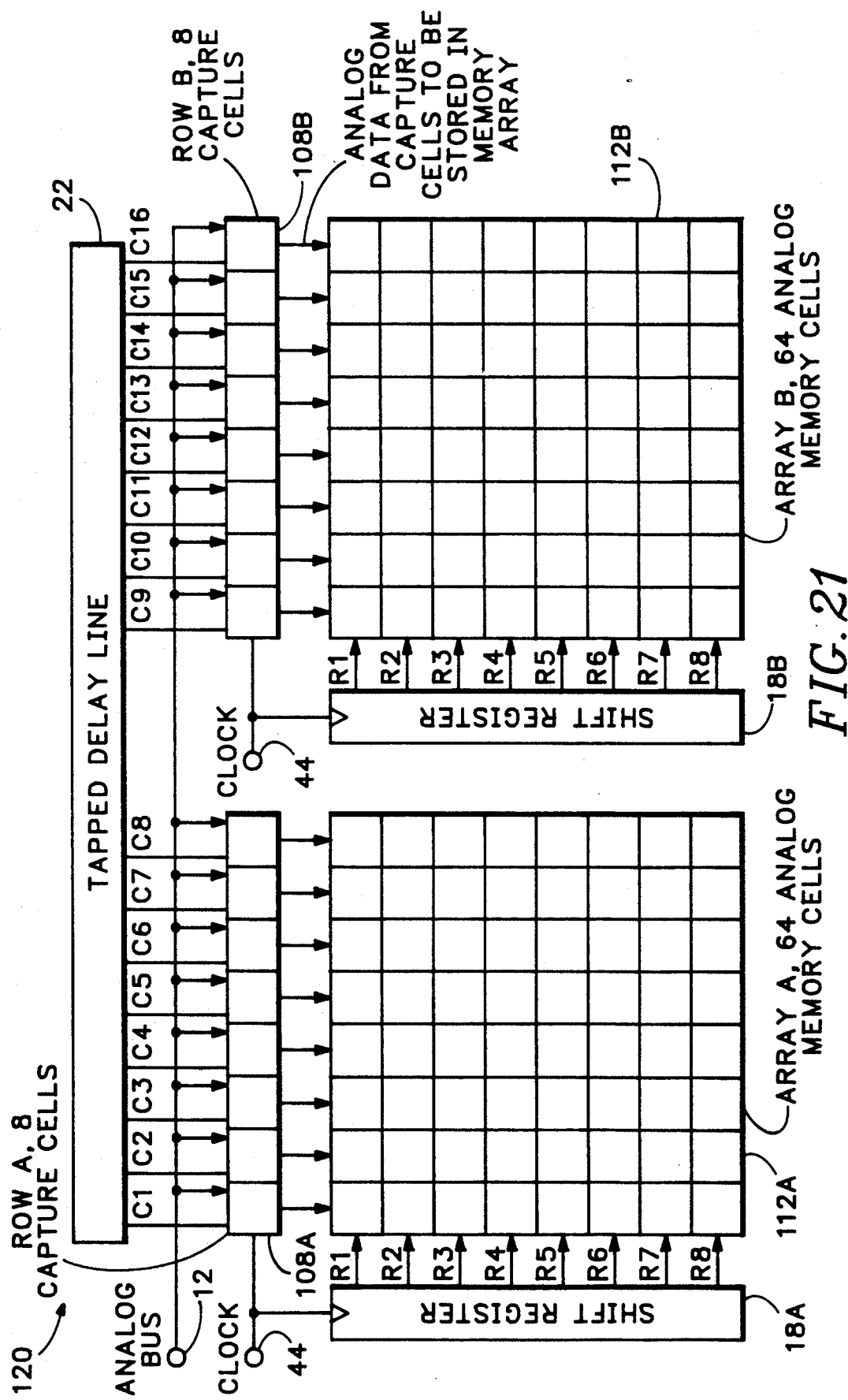
FIG. 21 is a functional block diagram of an alternative analog acquisition system for improving the effective transfer rate of stored analog data from the capture cells to the memory cells.

To reduce the capacitance of the analog bus 12, the acquisition system 106 shown in FIG. 20 allows the number of samples stored to be much greater than the number of capture cells. The signal on the analog bus 12 is first captured by the row of analog capture cells 108. The analog information stored in the row 108 is then transferred to the first row of memory cells 114 in memory array 112. The analog information from the next acquisition cycle is subsequently transferred to a successive row and the process is completed until the entire memory array 112 is full. While the acquisition system 106 reduces capacitance on the analog bus 12, the full sample rate may not be achieved due to the slow transfer rate of the analog data from the capture cells 110 to the memory cells 114. To solve this problem an alternative low capacitance acquisition system 106 is shown in FIG. 21. A first portion of the analog signal is first captured by a first row of capture cells 108A. The analog information that is captured in row 108A is subsequently transferred to a first row of memory cells in a first analog memory array 112A. While this transfer is taking place, a second portion of the analog signal on the analog bus 12 is captured by a second row of capture cells 108B. When the last capture cell in second row 108B captures the analog input the first row of capture cells 108A begins to capture a new signal while the information that has been captured in the second row 108B is transferred to a second analog memory array 112B. As before, a single tapped delay line provides strobe signals C1 through C16 to the first and second rows of capture cells 108A, 108B. By properly coordinating the timing of the strobe signals C1 through C16 and the row inputs R1 through R8 of each shift register 18A and 18B, the analog input can be sampled at a constant rate that is not a function of the slow transfer rate from the capture cell rows 108A, 108B to the analog memory arrays 112A, 112B.

Figure 22:
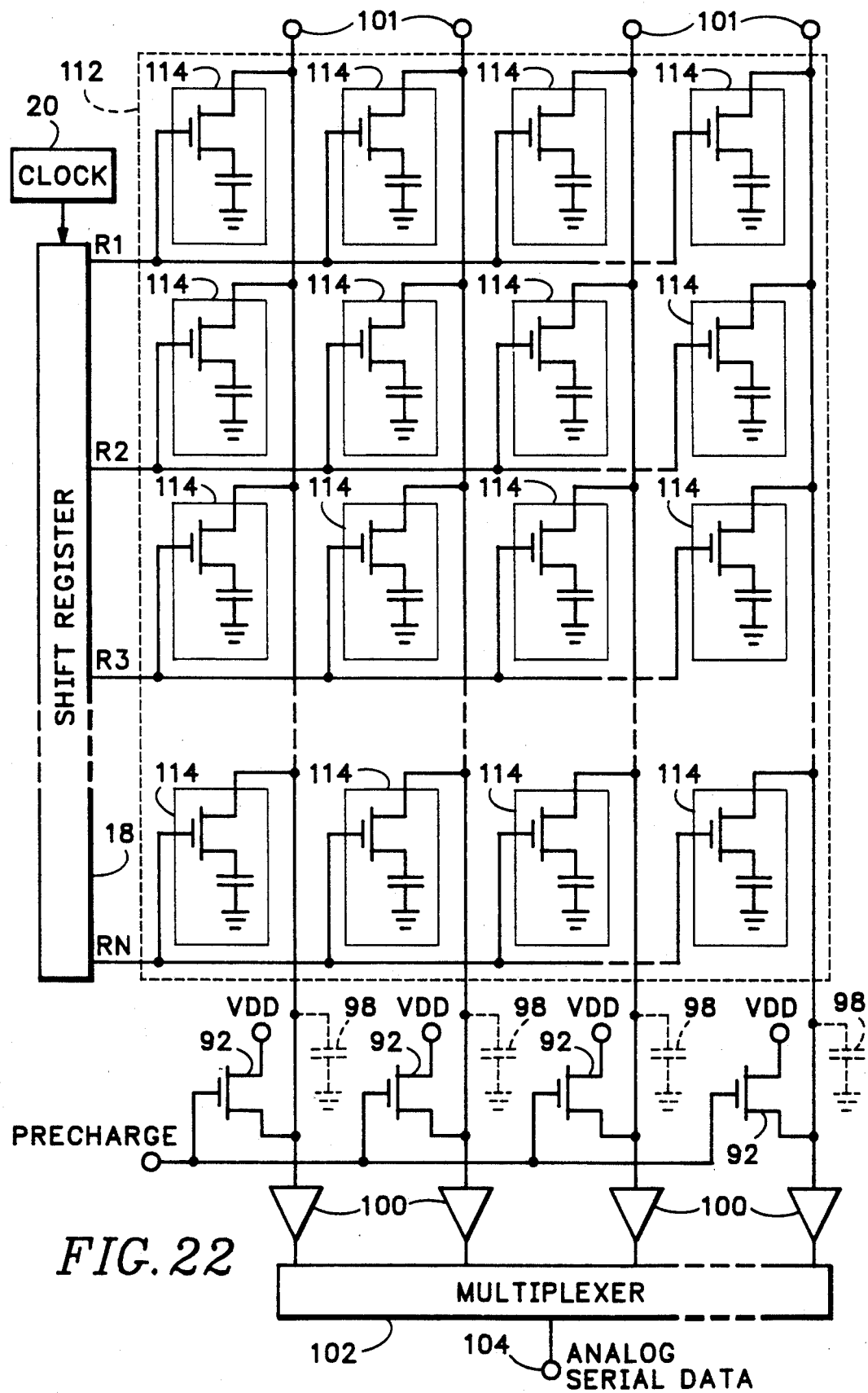
FIG. 22 is a schematic diagram of an alternative embodiment of a read out circuit.

An alternative readout system suitable for use in the acquisition systems 106 and 120 of FIGS. 20-21 is shown in FIG. 22. When information is being written to the memory array 112, precharge transistors 92 are turned off. To read out the information stored in the memory cells 114 of the memory array 112, the column lines 101 are initially charged by providing a positive-going pulse at the PRECHARGE input. One row line is subsequently enabled by activating an appropriate row input, which in turn couples the capacitor of each memory cell 114 to the column line 101 through the memory cell transistor. The column line 101 assumes a voltage between the precharged value and the value of the voltage on the capacitor in the memory cell 114. This voltage is determined by the relative sizes of the memory cell capacitor and the parasitic column line capacitance 98, as well as the initial charge stored in each of these capacitances. The resultant charge sharing between the memory cell capacitor and parasitic column line capacitance 98 thus determines the voltage on the column line 101. The voltage levels on the column lines 101 are buffered by buffer amplifiers 100 and are read out serially at the analog serial data terminal 104 through multiplexer 102.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. An analog acquisition system comprising:
   (a) an analog bus;
   (b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
   (c) a shift register having an input for receiving a clock signal and a plurality of shifted outputs coupled to the row inputs of the analog memory array; and
   (d) a tapped delay line having a plurality of strobe outputs for providing a propagating signal edge to the column inputs of the analog memory array.

2. An analog acquisition system as in claim 1 wherein each of the capture cells comprise:
   (a) an n-channel FET transistor having a source, a gate, and a drain coupled to the analog input;
   (b) an AND gate having an input coupled to the first digital input, another input coupled to the second digital input, and an output coupled to the gate of the n-channel FET transistor; and
   (c) a capacitor coupled to the source of the n-channel FET transistor for storing a captured signal.

3. An analog acquisition system as in claim 1 wherein each of the capture cells comprise:
   (a) a p-channel FET transistor having a drain, a gate, and a source coupled to the analog input;
   (b) a NAND gate having an input coupled to the first digital input, another input coupled to the second digital input, and an output coupled to the gate of the p-channel FET transistor; and
   (c) a capacitor coupled to the drain of the p-channel FET transistor for storing a captured signal.

4. An analog acquisition system as in claim 1 wherein the tapped delay line comprises a plurality of serially coupled buffer stages, each buffer stage having an input and an output coupled to the input of the next buffer stage in the series, the input of a first buffer stage receiving the clock signal and the output of each of the buffer stages providing a strobe output.

5. An analog acquisition system comprising:
   (a) an analog bus;
   (b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
   (c) a shift register having an input for receiving a clock signal and a plurality of shifted outputs coupled to the row inputs of the analog memory array; and
   (d) a tapped delay line having a plurality of strobe outputs coupled to the column inputs of the analog memory array, wherein the tapped delay line comprises a plurality of serially coupled first inverter stages, each first inverter stage having an input and an output coupled to the input of the next first inverter stage in the series, the input of a first inverter stage receiving the clock signal and the output of each of the first inverter stages forming a series of odd and even numbered terminals, the odd numbered terminals being coupled to the input of a buffer stage and the even numbered terminals being coupled to the input of a second inverter stage, and the output of each of the buffer stages and second inverter stages providing a strobe output.

6. An analog acquisition system comprising:
(a) an analog bus;
(b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
(c) a shift register having an input for receiving a clock signal and a plurality of shifted outputs coupled to the row inputs of the analog memory array; and
(d) a tapped delay line having a plurality of strobe outputs coupled to the column inputs of the analog memory array, wherein the tapped delay line comprises a plurality of serially coupled buffer stages, each buffer stage having an input and an output coupled to the input of the next buffer stage in the series, the input of a first buffer stage receiving the clock signal and the output of each of the buffer stages forming an intermediate terminal, each intermediate terminal being coupled to the input of N second buffer stages, where N is an integer greater than one, and the output of each second buffer stage provides a strobe output.

7. An analog acquisition system as in claim 6 wherein a first of the N second buffer stages has a delay equal to a predetermined minimum delay, a second of the N second buffer stages has a delay greater than the predetermined minimum delay, the delay of each of the successive second buffer stages being increased until a last of the N second buffer stages has a delay equal to a predetermined maximum delay.

8. An analog acquisition system comprising:
(a) an analog bus;
(b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
(c) a shift register having an input for receiving a clock signal and a plurality of shifted outputs coupled to the row inputs of the analog memory array; and
(d) a tapped delay line having a plurality of strobe outputs coupled to the column inputs of the analog memory array, wherein the tapped delay line comprises a plurality of serially coupled buffer stages, each buffer stage having an input and an output coupled to the input of the next buffer stage in the series, the input of a first buffer stage receiving the clock signal and the output of each of the buffer stages forming an intermediate terminal, each intermediate terminal in turn being coupled to the input of a second tapped delay line having N output terminals, where N is an integer greater than one, and each output terminal is coupled to the input of a second buffer stage and the output of each second buffer stage provides a strobe output.

9. An analog acquisition system as in claim 8 wherein the value of the delay associated with each of the N output terminals of the second tapped delay line ranges equally between a predetermined minimum delay and a predetermined maximum delay.

10. An analog acquisition system as in claim 8 wherein the second tapped delay line comprises a cascaded series of resistor and capacitor low pass filter sections.

11. An analog acquisition system comprising:
(a) an analog bus;
(b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
(c) a shift register having an input for receiving a clock signal and a plurality of shifted outputs coupled to the row inputs of the analog memory array; and
(d) a tapped delay line having a plurality of strobe outputs coupled to the column inputs of the analog memory array, wherein the tapped delay line comprises an odd numbered plurality of serially coupled inverter stages, each inverter stage having an input and an output coupled to the input of the next first inverter stage in the series, the output of a last inverter stage being coupled to the input of a first inverter stage forming an oscillating ring of inverter stages, and the output of at least one of the inverter stages providing a strobe output.

12. An analog acquisition system as in claim 1 further comprising means for adjusting the delay of the tapped delay line.

13. An analog acquisition system comprising:
(a) an analog bus;
(b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
(c) a shift register having an input for receiving a clock signal and a plurality of shifted outputs coupled to the row inputs of the analog memory array; and
(d) a tapered delay line having a plurality of strobe outputs coupled to the column inputs of the analog memory array, wherein the tapped delay line further comprises a delay voltage input, the delay of the tapped delay line being proportional to a voltage applied to the delay voltage input.

14. An analog acquisition system as in claim 13 wherein the tapped delay line comprises at least one inverter stage providing a delay between an input and an output, the inverter stage including a delay voltage input.

15. An analog acquisition system as in claim 14 wherein the inverter stage comprises:
   (a) a p-channel FET transistor having a gate coupled to the input and a drain coupled to the output;
   (b) a first n-channel FET transistor having a gate coupled to the input, a drain coupled to the output, and a source; and
   (c) a second n-channel FET transistor having a gate coupled to the delay voltage input and a drain coupled to the source of the first n-channel FET transistor.

16. An analog acquisition system as in claim 14 wherein the inverter stage comprises:
   (a) a first p-channel FET transistor having a gate coupled to the input, a drain coupled to the output, and a source;
   (b) an n-channel FET transistor having a gate coupled to the input and a drain coupled to the output; and
   (c) a second p-channel FET transistor having a gate coupled to the delay voltage input and a drain coupled to the source of the first p-channel FET transistor.

17. An analog acquisition system as in claim 14 wherein the inverter stage comprises:
   (a) a p-channel FET transistor having a gate coupled to the input, a drain coupled to the output, and a source coupled to the delay voltage input; and
   (b) an n-channel FET transistor having a gate coupled to the input and a drain coupled to the output.

18. An analog acquisition system as in claim 13 wherein the tapped delay line comprises at least one buffer stage providing a delay between an input and an output, the buffer stage including a delay voltage input.

19. An analog acquisition system as in claim 18 wherein the buffer stage comprises:
   two nonadjustable inverter stages serially coupled at an intermediate node; and
   a nonlinear voltage adjustable capacitor coupled between the intermediate node and the delay voltage input.

20. An analog acquisition system as in claim 13 further comprising a coincidence detector having a first input for receiving a clock signal passed through the tapped delay line, a second input for directly receiving the clock signal, and an output for providing a control voltage proportional to the difference between the clock signals at the first and second inputs, the output being coupled to the delay voltage input of the tapped delay line.

21. An analog acquisition system as in claim 20 wherein the coincidence detector comprises:
   (a) a D-type flip-flop having a D input coupled to the first input, a clock input coupled to the second input, and a Q output;
   (b) an up/down counter having an up/down input coupled to the Q output of the D-type flip-flop, a clock input coupled to the second input, and an output; and
   (c) a digital to analog converter having an input coupled to the output of the up/down counter and an output for providing the control voltage, the output being coupled to the output of the coincidence detector.

22. An analog acquisition system as in claim 20 wherein the coincidence detector comprises:
   (a) an n-channel FET transistor having a drain coupled to the first input, a gate coupled to the second input and a source;
   (b) a first capacitor coupled to the source of the n-channel FET transistor;
   (c) a second capacitor coupled to the output of the coincidence detector, the voltage stored on the second capacitor providing the control voltage; and
   (d) switch means coupled between the first and second capacitors that is normally open and is closed after each clock cycle of the clock signal.

23. An analog acquisition system comprising:
   (a) an analog bus;
   (b) an analog memory array including analog capture cells for capturing and storing a signal on the analog bus, each capture cell having an analog input coupled to the analog bus and first and second digital inputs, the analog capture cells being arranged in a plurality of columns and rows, each column having an associated column input coupled to the first digital input of each analog capture cell in the column, and each row having an associated row input coupled to the second digital input of each analog capture cell in the row;
   (c) a shift register having an input for receiving a clock signal and a plurality of shifted outputs coupled to the row inputs of the analog memory array; and
   (d) a tapped delay line having a plurality of strobe outputs coupled to the column inputs of the analog memory array, wherein each of the analog capture cells further comprise an enable input for selectively disabling the capture cell from capturing and storing a signal from the analog bus for a predetermined period of time.

24. An analog acquisition system as in claim 1 further comprising means for reading out the stored analog data in each of the capture cells.

25. An analog acquisition system as in claim 24 wherein the read out means comprises:
   (a) a plurality of buffer stages having an input and an output, each input buffer stage being respectively coupled to the capacitor of the corresponding capture cell; and
   (b) a multiplexer having a plurality of inputs coupled to the outputs of the buffer stages and an output for providing analog serial data.

26. An analog acquisition system comprising:
   (a) an analog bus;
   (b) a row of analog capture cells for capturing and storing a signal on the analog bus, each capture cell having an analog input coupled to the analog bus, an analog output, and a digital input;
   (c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;

(d) a shift register having an input for receiving a clock signal and a plurality of shifted outputs coupled to the row inputs of the analog memory array; and (e) a tapped delay line having a plurality of strobe outputs for providing a propagating signal edge to the digital inputs of the row of analog capture cells.

27. An analog acquisition system as in claim 26 wherein each of the analog capture cells comprise:
   (a) an n-channel FET transistor having a source coupled to the analog output, a gate coupled to the digital input, and a drain coupled to the analog input; and
   (b) a capacitor coupled to the source of the n-channel FET transistor.

28. An analog acquisition system as in claim 26 wherein each of the analog capture cells comprise:
   (a) a p-channel FET transistor having a drain coupled to the analog output, a gate coupled to the digital input, and a source coupled to the analog input; and
   (b) a capacitor coupled to the drain of the p-channel FET transistor.

29. An analog acquisition system as in claim 26 wherein each of the analog memory cells comprise:
   (a) an n-channel FET transistor having a source, a gate coupled to the digital input, and a drain coupled to the analog input; and
   (b) a capacitor coupled to the source of the n-channel FET transistor.

30. An analog acquisition system as in claim 26 wherein each of the analog memory cells comprise:
   (a) a p-channel FET transistor having a drain, a gate coupled to the digital input, and a source coupled to the analog input; and
   (b) a capacitor coupled to the drain of the p-channel FET transistor.

31. An analog acquisition system as in claim 26 wherein the tapped delay line comprises a plurality of serially coupled buffer stages, each buffer stage having an input and an output coupled to the input of the next buffer stage in the series, the input of a first buffer stage receiving the clock signal and the output of each of the buffer stages providing a strobe output.

32. An analog acquisition system comprising:
   (a) an analog bus;
   (b) a row of analog capture cells for capturing and storing a signal on the analog bus, each capture cell having an analog input coupled to the analog bus, an analog output, and a digital input;
   (c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;
   (d) a shift register having an input for receiving a clock signal and a plurality of shifted outputs coupled to the row inputs of the analog memory array; and
   (e) a tapped delay line having a plurality of strobe outputs coupled to the digital inputs of the row of analog capture cells, wherein the tapped delay line comprises a plurality of serially coupled first inverter stages, each first inverter stage having an input and an output coupled to the input of the next first inverter stage in the series, the input of a first inverter stage receiving the clock signal and the output of each of the first inverter stages forming a series of odd and even numbered terminals, the odd numbered terminals being coupled to the input of a buffer stage and the even numbered terminals being coupled to the input of a second inverter stage, and the output of each of the buffer stages and second inverter stages providing a strobe output.

33. An analog acquisition system comprising:
   (a) an analog bus;
   (b) a row of analog capture cells for capturing and storing a signal on the analog bus, each capture cell having an analog input coupled to the analog bus, an analog output, and a digital input;
   (c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;
   (d) a shift register having an input for receiving a clock signal and a plurality of shifted outputs coupled to the row inputs of the analog memory array; and
   (e) a tapped delay line having a plurality of strobe outputs coupled to the digital inputs of the row of analog capture cells, wherein the tapped delay line comprises a plurality of serially coupled buffer stages, each buffer stage having an input and an output coupled to the input of the next buffer stage in the series, the input of a first buffer stage receiving the clock signal and the output of each of the buffer stages forming an intermediate terminal, each intermediate terminal being coupled to the input of N second buffer stages, where N is an integer greater than one, and the output of each second buffer stage provides a strobe output.

34. An analog acquisition system as in claim 33 wherein a first of the N second buffer stages has a delay equal to a predetermined minimum delay, a second of the N second buffer stages has a delay greater than the predetermined minimum delay, the delay of each of the successive second buffer stages being increased until a last of the N second buffer stages has a delay equal to a predetermined maximum delay.

35. An analog acquisition system comprising:
   (a) an analog bus;
   (b) a row of analog capture cells for capturing and storing a signal on the analog bus, each capture cell having an analog input coupled to the analog bus, an analog output, and a digital input;
   (c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;

(d) a shift register having an input for receiving a clock signal and a plurality of shifted outputs coupled to the row inputs of the analog memory array; and (e) a tapped delay line having a plurality of strobe outputs coupled to the digital inputs of the row of analog capture cells, wherein the tapped delay line comprises a plurality of serially coupled buffer stages, each buffer stage having an input and an output coupled to the input of the next buffer stage in the series, the input of a first buffer stage receiving the clock signal and the output of each of the buffer stages forming an intermediate terminal, each intermediate terminal in turn being coupled to the input of a second tapped delay line having N output terminals, where N is an integer greater than one, and each output terminal is coupled to the input of a second buffer stage and the output of each second buffer stage provides a strobe output.

36. An analog acquisition system as in claim 35 wherein the value of the delay associated with each of the N output terminals of the second tapped delay line ranges equally between a predetermined minimum delay and a predetermined maximum delay.

37. An analog acquisition system as in claim 35 wherein the second analog tapped delay line comprises a cascaded series of resistor and capacitor low pass filter sections.

38. An analog acquisition system comprising:
(a) an analog bus;
(b) a row of analog capture cells for capturing and storing a signal on the analog bus, each capture cell having an analog input coupled to the analog bus, an analog output, and a digital input;
(c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;
(d) a shift register having an input for receiving a clock signal and a plurality of shifted outputs coupled to the row inputs of the analog memory array; and
(e) a tapped delay line having a plurality of strobe outputs coupled to the digital inputs of the row of analog capture cells, wherein the tapped delay line comprises an odd numbered plurality of serially coupled inverter stages, each inverter stage having an input and an output coupled to the input of the next first inverter stage in the series, the output of a last inverter stage being coupled to the input of a first inverter stage forming an oscillating ring of inverter stages, and the output of each of the inverter stages each providing a strobe output.

39. An analog acquisition system as in claim 26 further comprising means for adjusting the delay of the tapped delay line.

40. An analog acquisition system comprising:

(a) an analog bus;
(b) a row of analog capture cells for capturing and storing a signal on the analog bus, each capture cell having an analog input coupled to the analog bus, an analog output, and a digital input;
(c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;
(d) a shift register having an input for receiving a clock signal and a plurality of shifted outputs coupled to the row inputs of the analog memory array; and
(e) a tapped delay line having a plurality of strobe outputs coupled to the digital inputs of the row of analog capture cells, wherein the tapped delay line further comprises a delay voltage input, the delay of the tapped delay line being a function of a voltage applied to the delay voltage input.

41. An analog acquisition system as in claim 40 wherein the tapped delay line comprises at least one inverter stage providing a delay between an input and an output, the inverter stage including a delay voltage input.

42. An analog acquisition system as in claim 41 wherein the inverter stage comprises:
(a) a p-channel FET transistor having a gate coupled to the input and a drain coupled to the output;
(b) a first n-channel FET transistor having a gate coupled to the input, a drain coupled to the output, and a source; and
(c) a second n-channel FET transistor having a gate coupled to the delay voltage input and a drain coupled to the source of the first n-channel FET transistor.

43. An analog acquisition system as in claim 41 wherein the inverter stage comprises:
(a) a first p-channel FET transistor having a gate coupled to the input, a drain coupled to the output, and a source;
(b) an n-channel FET transistor having a gate coupled to the input and a drain coupled to the output; and
(c) a second p-channel FET transistor having a gate coupled to the delay voltage input and a drain coupled to the source of the first p-channel FET transistor.

44. An analog acquisition system as in claim 41 wherein the inverter stage comprises:
(a) a p-channel FET transistor having a gate coupled to the input, a drain coupled to the output, and a source coupled to the delay voltage input; and
(b) an n-channel FET transistor having a gate coupled to the input and a drain coupled to the output.

45. An analog acquisition system as in claim 40 wherein the tapped delay line comprises at least one buffer stage providing a delay between an input and an output, the buffer stage including a delay voltage input.

46. An analog acquisition system as in claim 45 wherein the buffer stage comprises:

two nonadjustable inverter stages serially coupled at an intermediate node; and a nonlinear voltage adjustable capacitor coupled between the intermediate node and the delay voltage input.

47. An analog acquisition system as in claim 40 further comprising a coincidence detector having a first input for receiving a clock signal passed through the tapped delay line, a second input for directly receiving the clock signal, and an output for providing a control voltage that is a function of the difference between the clock signals at the first and second inputs, the output being coupled to the delay voltage input of the tapped delay line.

48. An analog acquisition system as in claim 44 wherein the coincidence detector comprises:
   (a) a D-type flip-flop having a D input coupled to the first input, a clock input coupled to the second input, and a Q output;
   (b) an up/down counter having an up/down input coupled to the Q output of the D-type flip-flop, a clock input coupled to the second input, and an output; and
   (c) a digital to analog converter having an input coupled to the output of the up/down counter and an output for providing the control voltage, the output being coupled to the output of the coincidence detector.

49. An analog acquisition system as in claim 44 wherein the coincidence detector comprises:
   (a) an n-channel FET transistor having a drain coupled to the first input, a gate coupled to the second input and a source;
   (b) a first capacitor coupled to the source of the n-channel FET transistor;
   (c) a second capacitor coupled to the output of the coincidence detector, the voltage stored on the second capacitor providing the control voltage; and
   (d) switch means coupled between the first and second capacitors that is normally open and is closed after each clock cycle of the clock signal.

50. An analog acquisition system comprising:
   (a) an analog bus;
   (b) a row of analog capture cells for capturing and storing a signal on the analog bus, each capture cell having an analog input coupled to the analog bus, an analog output, and a digital input;
   (c) an analog memory array including analog memory cells for receiving and storing the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell, and each row having an associated row input coupled to the digital input of each memory cell in the row;
   (d) a shift register having an input for receiving a clock signal and a plurality of shifted outputs coupled to the row inputs of the analog memory array; and
   (e) a tapped delay line having a plurality of strobe outputs coupled to the digital inputs of the row of analog capture cells, wherein each of the analog capture cells further comprise an enable input for selectively disabling the capture cell from capturing and storing a signal from the analog bus for a predetermined period of time.

51. An analog acquisition system as in claim 26 further comprising means for reading out the stored analog data in each of the memory cells.

52. An analog acquisition system as in claim 51 wherein the read out means comprises:
   (a) a plurality of buffer stages having an input and an output, each input buffer stage being respectively coupled to the capacitor of the corresponding memory cell; and
   (b) a multiplexer having a plurality of inputs coupled to the outputs of the buffer stages and an output for providing analog serial data.

53. An analog acquisition system as in claim 51 wherein the read out means comprises:
   (a) means for precharging the column inputs to a predetermined voltage;
   (b) means for selecting a row of memory cells;
   (c) means for coupling the stored signal in each of the memory cells to the respective column input; and
   (d) a multiplexer having a plurality of inputs coupled to the column inputs and an output for providing analog serial data.

54. An analog acquisition system comprising:
   (a) an analog bus;
   (b) a first row of analog capture cells for capturing and storing a first portion of a signal on the analog bus, each capture cell having an analog input coupled to the analog bus, an analog output, and a digital input;
   (c) a first analog memory array including analog memory cells for receiving and storing the first portion of the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell in the first row of analog capture cells, and each memory cell row having an associated row input coupled to the digital input of each memory cell in the row;
   (d) a first shift register having an input for receiving a clock signal and a plurality of shifted outputs coupled to the row inputs of the first analog memory array;
   (e) a second row of analog capture cells for capturing and storing a second portion of the signal on the analog bus, each capture cell having an analog input coupled to the analog bus, an analog output, and a digital input;
   (f) a second analog memory array including analog memory cells for receiving and storing the second portion of the signal captured by the analog capture cells, each memory cell having an analog input and a digital input, the memory cells being arranged in a plurality of columns and rows, each column having an associated column input coupled to the analog input of each memory cell in the column and to the analog output of the corresponding analog capture cell in the second row of analog capture cells, and each memory cell row having an associated row input coupled to the digital input of each memory cell in the row;
   (g) a second shift register having an input for receiving a clock signal and a plurality of shifted outputs coupled to the row inputs of the second analog memory array; and (h) a tapped delay line having a plurality of strobe outputs coupled to the digital inputs of the first and second rows of analog capture cells.

55. An analog acquisition system as in claim 54 further comprising means for adjusting the delay of the tapped delay line.

56. An analog acquisition system as in claim 54 wherein each of the analog capture cells further comprise an enable input for selectively disabling the capture cell from capturing and storing a signal from the analog bus for a predetermined period of time.

57. An analog acquisition system as in claim 54 further comprising means for reading out the stored analog data in each of the memory cells.

58. A method for capturing and storing a signal on an analog bus, the method comprising:

(a) coupling an array of digitally selectable analog capture cells arranged into rows and columns to the analog bus;

(b) propagating a signal edge through a tapped delay line to provide a plurality of sequential delayed strobe outputs;

(c) sequentially selecting each analog capture cell within the first row of analog capture cells with the strobe outputs for sequentially capturing and storing the signal on the analog bus; and (d) repeating steps (b) and (c) for each subsequent row of capture cells until all of the capture cells within the array have been selected.

59. A method as in claim 58 further including the step of adjusting the delay of the tapped delay line.

60. A method as in claim 58 further including the step of selectively enabling and disabling the capture cells from capturing and storing a signal from the analog bus for a predetermined period of time.

61. A method as in claim 58 further including the step of reading out the stored signal from each of the capture cells.

62. A method for capturing and storing a signal on an analog bus, the method comprising:

(a) coupling a row of digitally selectable analog capture cells to the analog bus;

(b) propagating a signal edge through a tapped delay line to provide a plurality of sequential delayed strobe outputs;

(c) sequentially selecting each analog capture cell with the strobe outputs for sequentially capturing and storing the signal on the analog bus;

(d) transferring the stored signal to a first row of an array of digitally selectable memory cells arranged into rows and columns; and (e) repeating steps (b), (c) and (d) for each subsequent row of analog memory cells within the analog memory array until all of the rows within the array have been selected.

63. A method as in claim 62 further including the step of adjusting the delay of the tapped delay line.

64. A method as in claim 62 further including the step of selectively enabling and disabling the capture cells from capturing and storing a signal from the analog bus for a predetermined period of time.

65. A method as in claim 62 further including the step of reading out the stored signal from each of the analog memory cells.

66. A method as in claim 62 wherein step (c) is performed on a first portion of the signal on the analog bus and step (d) is performed on a second portion of the signal on the analog bus.

* * * * *

UNITED STATES PATENT AND TRADEMARK OFFICE
CERTIFICATE OF CORRECTION

PATENT NO. : 5,144,525

DATED : September 1, 1992

INVENTOR(S) : Charles L. Saxe, Steven K. Sullivan and Grigory Kogan

It is certified that error appears in the above-identified patent and that said Letters Patent is hereby corrected as shown below:

Col. 14, line 63 - change "tapered" to "tapped"

Col. 19, line 30 - delete "analog"

Signed and Sealed this

Fourth Day of January, 1994

*Attest:*

BRUCE LEHMAN

*Attesting Officer*      *Commissioner of Patents and Trademarks*